(12) United States Patent
Sasaki et al.

(10) Patent No.: US 7,927,920 B2
(45) Date of Patent: *Apr. 19, 2011

(54) METHOD OF MANUFACTURING ELECTRONIC COMPONENT PACKAGE, AND WAFER AND SUBSTRUCTURE USED FOR MANUFACTURING ELECTRONIC COMPONENT PACKAGE

(75) Inventors: Yoshitaka Sasaki, Milpitas, CA (US); Tatsushi Shimizu, Hong Kong (CN)

(73) Assignees: Headway Technologies, Inc., Milpitas, CA (US); SAE Magnetics (H.K.) Ltd., Hong Kong (CN)

( * ) Notice: Subject to any disclaimer, the term of this patent is extended or adjusted under 35 U.S.C. 154(b) by 325 days.

This patent is subject to a terminal disclaimer.

(21) Appl. No.: 11/706,367

(22) Filed: Feb. 15, 2007

(65) Prior Publication Data

US 2008/0197484 A1  Aug. 21, 2008

(51) Int. Cl.
*H01L 21/44* (2006.01)
(52) U.S. Cl. .......... 438/110; 438/113; 227/E23.01; 227/E21.001
(58) Field of Classification Search ........ 438/113, 438/107; 29/592.1, 846; 257/693, 696
See application file for complete search history.

(56) References Cited

U.S. PATENT DOCUMENTS

| 3,489,952 A | * | 1/1970 | Hinchey | ............ 361/704 |
| 5,926,380 A | * | 7/1999 | Kim | ............ 361/813 |
| 5,976,912 A | | 11/1999 | Fukutomi et al. | |
| 6,746,897 B2 | * | 6/2004 | Fukutomi et al. | ............ 438/110 |

FOREIGN PATENT DOCUMENTS

| JP | A 2001-35993 | 2/2001 |
| JP | A 2001-244403 | 9/2001 |
| JP | B2-3247384 | 1/2002 |
| JP | 2003163324 A * | 6/2003 |

OTHER PUBLICATIONS

Japanese Office Action in Japanese Patent Application No. 2007-216732, dated May 26, 2010, with English translation.

* cited by examiner

*Primary Examiner* — Thanh Nguyen
(74) *Attorney, Agent, or Firm* — Oliff & Berridge, PLC

(57) ABSTRACT

In a method of manufacturing an electronic component package, first, there is fabricated a wafer incorporating a plurality of sets of external connecting terminals corresponding to a plurality of electronic component packages, and a retainer for retaining the plurality of sets of external connecting terminals, the wafer including a plurality of pre-base portions that will be separated from one another later to be bases of the electronic component packages. Next, at least one electronic component chip is bonded to each of the pre-base portions of the wafer. Next, electrodes of the electronic component chips are connected to the external connecting terminals. Next, the electronic component chips are sealed. Next, the wafer is cut so that the pre-base portions are separated from one another and the plurality of bases are thereby formed.

10 Claims, 37 Drawing Sheets

METHOD OF MANUFACTURING ELECTRONIC COMPONENT PACKAGE, AND WAFER AND SUBSTRUCTURE USED FOR MANUFACTURING ELECTRONIC COMPONENT PACKAGE

BACKGROUND OF THE INVENTION

1. Field of the Invention

The present invention relates to a method of manufacturing an electronic component package including at least one chip and a plurality of external connecting terminals, and a wafer and a substructure used for manufacturing an electronic component package.

2. Description of the Related Art

A reduction in weight and an improvement in performance have been desired for mobile apparatuses represented by cellular phones and notebook personal computers. Higher integration of electronic components used for mobile apparatuses have been sought, accordingly.

A system large-scale integrated circuit (LSI) and a multi-chip module have been known as highly integrated electronic components. The system LSI is a single integrated circuit (IC) in which functions of various electronic components are incorporated. The multi-chip module is a module made up of a plurality of chips integrated through the use of a wiring substrate, for example.

The system LSI has a benefit that it allows the integration density to be higher and the number of leads to be minimized. On the other hand, the multi-chip module has a benefit that it facilitates the implementation of a single module having desired functions by integrating a plurality of chips having different functions.

A description will now be given of a conventional method of manufacturing an electronic component package including at least one chip and a plurality of external connecting terminals, such as a system LSI or a multi-chip module. In a typical conventional method of manufacturing an electronic component package, at least one chip is mounted on a base such as a wiring substrate prepared for a single electronic component package, a terminal of the chip is connected to an external connecting terminal, and the connecting portion between the terminal of the chip and the external connecting terminal is sealed. The connection between the terminal of the chip and the external connecting terminal is performed by wire bonding or flip-chip, for example. In a case in which flip-chip is employed, the terminal of the chip and the external connecting terminal are connected to each other through a lead inside the wiring substrate. Wiring among chips in the multi-chip module is also performed by wire bonding or flip-chip, for example.

JP 2001-035993A discloses a multi-chip module in which a bonding pad connected to a chip is connected to a lead that is an external connecting terminal by wire bonding. JP 2001-035993A further discloses a technique of forming inter-chip wiring and the bonding pad through a wire-forming process. According to this publication, the wire-forming process includes a film forming step, a lithography step and an etching step, for example.

JP 2001-244403A discloses a technique wherein inter-chip wiring and pads for external connection of a multi-chip module are formed through a wafer process. According to this publication, the wafer process includes a series of steps of forming an insulating layer, forming via holes, embedding plug metals, flattening, forming films by sputtering, and forming a wiring pattern through photolithography techniques.

U.S. Pat. No. 5,926,380 discloses a method of manufacturing a chip-size semiconductor package as will now be described. In this method, first, a lead frame is bonded to the top surface of a wafer in which a plurality of semiconductor chips each having a plurality of pads on the surface thereof and aligned with chip partition lines are formed. Next, leads of the lead frame and the pads of the semiconductor chips are connected to each other by wire bonding. Next, the top surfaces of the leads closer to the base ends are exposed and the top and bottom surfaces of the wafer are molded. Next, conductive metallic plating is performed on the exposed top surfaces of the leads closer to the base ends. Next, the wafer and the lead frame are cut to complete the semiconductor packages.

In the typical conventional method of manufacturing an electronic component package, a series of steps, such as mounting of at least one chip on the base, connection of the terminals of the chip to external connecting terminals, and sealing of the connecting portions between the terminals of the chip and the external connecting terminals, are performed for each electronic component package. This typical method has a problem that it is difficult to mass-produce electronic component packages at low costs in a short period of time.

The method of manufacturing a chip-size semiconductor package disclosed in U.S. Pat. No. 5,926,380 makes it possible to mass-produce electronic component packages at low costs. In this method, however, to alter the specifications of semiconductor chips, it is required to start with design of a wafer including a plurality of semiconductor chips. Therefore, the method has a problem that it is difficult to respond to alterations to the specifications flexibly and quickly. In addition, it is impossible to manufacture multi-chip modules through this method.

OBJECT AND SUMMARY OF THE INVENTION

It is an object of the invention to provide a method of manufacturing an electronic component package, the method allowing electronic component packages to be mass-produced at low costs in a short period of time and making it possible to respond to alterations to specifications flexibly and quickly, and to provide a wafer and a substructure used for manufacturing the electronic component package.

An electronic component package manufactured through a method of manufacturing an electronic component package of the invention incorporates: a base incorporating a plurality of external connecting terminals; and at least one electronic component chip that is bonded to the base and electrically connected to at least one of the external connecting terminals.

The method of manufacturing an electronic component package of the invention includes the steps of fabricating a wafer incorporating a plurality of sets of external connecting terminals corresponding to a plurality of electronic component packages, and a retainer for retaining the plurality of sets of external connecting terminals, the wafer including a plurality of pre-base portions that will be separated from one another later so that each of them will thereby become the base; bonding at least one electronic component chip to each of the pre-base portions of the wafer; and cutting the wafer so that the pre-base portions are separated from one another and a plurality of bases are thereby formed, the step being performed after the step of bonding the electronic component chip to each of the pre-base portions.

In the method of the invention, the wafer may further incorporate a plurality of chip bonding conductor layers to each of which the at least one electronic component chip is to be bonded, the plurality of chip bonding conductor layers being disposed in the plurality of pre-base portions, respectively.

In the method of the invention, the wafer may further incorporate a plurality of sets of terminal conductor layers to which the at least one electronic component chip is to be electrically connected, the plurality of sets of terminal conductor layers being connected to the plurality of sets of external connecting terminals.

In the method of the invention, the wafer may further incorporate: a plurality of sets of terminal conductor layers to which the at least one electronic component chip is to be electrically connected, the plurality of sets of terminal conductor layers being connected to the plurality of sets of external connecting terminals; and a plurality of chip bonding conductor layers to each of which the at least one electronic component chip is to be bonded, the plurality of chip bonding conductor layers being disposed in the plurality of pre-base portions, respectively.

In the method of the invention, the electronic component chip may incorporate a plurality of electrodes, and the electronic component package may incorporate a plurality of terminal connecting portions each of which connects at least one of the electrodes and at least one of the external connecting terminals to each other. In this case, the method further includes the step of forming the terminal connecting portions between the step of bonding the electronic component chip to each of the pre-base portions and the step of cutting the wafer.

Each of the pre-base portions may have a top surface, the top surface including: a chip bonding surface to which the at least one electronic component chip is to be bonded; and connecting surfaces of the external connecting terminals to which the terminal connecting portions are to be connected, the connecting surfaces being located higher than the chip bonding surface.

The step of forming the terminal connecting portions may include the steps of: forming an insulating layer having a flattened top surface and covering the wafer and the electronic component chip; forming a plurality of openings in the insulating layer for exposing the external connecting terminals and the electrodes; and forming the terminal connecting portions by plating so that portions thereof are inserted to the openings.

The electronic component package may incorporate a plurality of electronic component chips and may further incorporate at least one inter-chip connecting portion for electrically connecting electrodes of the plurality of electronic component chips to one another, and the inter-chip connecting portion may be formed at the same time as the terminal connecting portions are formed.

The method of manufacturing an electronic component package of the invention may further include the step of forming a sealer for sealing the electronic component chip between the step of bonding the electronic component chip to each of the pre-base portions and the step of cutting the wafer.

In the method of the invention, the base may have a side surface, and end faces of the plurality of external connecting terminals may be exposed at the side surface of the base. In this case, the electronic component package may further incorporate a plurality of terminal pins respectively connected to the external connecting terminals, and the method may further include the step of connecting the terminal pins to the end faces of the external connecting terminals after the step of cutting the wafer.

In the method of the invention, the base may have a side surface, and the method may further include the step of forming the side surface such that a portion of each of the plurality of external connecting terminals protrudes from the side surface.

In the method of the invention, the retainer may incorporate: a base forming portion disposed in each of the pre-base portions; and a portion to be removed made of a material different from a material of the base forming portion and disposed around each of the pre-base portions, each of the external connecting terminals extending across the base forming portion and the portion to be removed. In this case, the method further includes the step of removing the portion to be removed after the step of bonding the electronic component chip to each of the pre-base portions.

A wafer for electronic component packages of the invention is used for manufacturing a plurality of electronic component packages each of which incorporates: a base incorporating a plurality of external connecting terminals; and at least one electronic component chip that is bonded to the base and electrically connected to at least one of the external connecting terminals. The wafer of the invention incorporates: a plurality of sets of external connecting terminals corresponding to the plurality of electronic component packages; and a retainer for retaining the plurality of sets of external connecting terminals, the wafer including a plurality of pre-base portions that will be each subjected to bonding of the at least one electronic component chip thereto and will be subjected to separation from one another later so that each of them will thereby become the base.

The wafer of the invention may further incorporate a plurality of chip bonding conductor layers to each of which the at least one electronic component chip is to be bonded, the plurality of chip bonding conductor layers being disposed in the plurality of pre-base portions, respectively.

The wafer of the invention may further incorporate a plurality of sets of terminal conductor layers to which the at least one electronic component chip is to be electrically connected, the plurality of sets of terminal conductor layers being connected to the plurality of sets of external connecting terminals.

The wafer of the invention may further incorporate: a plurality of sets of terminal conductor layers to which the at least one electronic component chip is to be electrically connected, the plurality of sets of terminal conductor layers being connected to the plurality of sets of external connecting terminals; and a plurality of chip bonding conductor layers to each of which the at least one electronic component chip is to be bonded, the plurality of chip bonding conductor layers being disposed in the plurality of pre-base portions, respectively.

In the wafer of the invention, each of the pre-base portions may have a top surface, the top surface including: a chip bonding surface to which the at least one electronic component chip is to be bonded; and connecting surfaces of the external connecting terminals that are to be electrically connected to the at least one electronic component chip, the connecting surfaces being located higher than the chip bonding surface.

In the wafer of the invention, the retainer may incorporate: a base forming portion disposed in each of the pre-base portions; and a portion to be removed made of a material different from a material of the base forming portion and disposed around each of the pre-base portions, each of the external connecting terminals extending across the base forming portion and the portion to be removed.

A first method of manufacturing a wafer for electronic component packages of the invention is a method of manufacturing the wafer for electronic component packages of the invention, and includes the steps of: forming a lead frame including the plurality of sets of external connecting terminals; and integrating the lead frame and the retainer with each other.

A second method of manufacturing a wafer for electronic component packages of the invention is a method of manufacturing the wafer for electronic component packages of the invention, and includes the steps of: forming a conductor layer on the retainer; and forming the plurality of sets of external connecting terminals by patterning the conductor layer.

A third method of manufacturing a wafer for electronic component packages of the invention is a method of manufacturing the wafer for electronic component packages of the invention, and includes the steps of: forming the retainer to have grooves for accommodating the plurality of sets of external connecting terminals; and forming the plurality of sets of external connecting terminals by filling the grooves with a conductive material that will be the plurality of sets of external connecting terminals.

A fourth method of manufacturing a wafer for electronic component packages of the invention is a method of manufacturing the wafer for electronic component packages of the invention, and includes the steps of: integrating the plurality of sets of external connecting terminals and the retainer with each other; and forming at the same time: a plurality of sets of terminal conductor layers to which the at least one electronic component chip is to be electrically connected, the plurality of sets of terminal conductor layers being connected to the plurality of sets of external connecting terminals; and a plurality of chip bonding conductor layers to each of which the at least one electronic component chip is to be bonded, the plurality of chip bonding conductor layers being disposed in the plurality of pre-base portions, respectively.

A substructure for electronic component packages of the invention is used for manufacturing a plurality of electronic component packages each of which comprises: a base incorporating a plurality of external connecting terminals; and at least one electronic component chip that is bonded to the base and electrically connected to at least one of the external connecting terminals. The substructure of the invention incorporates: a wafer incorporating a plurality of sets of external connecting terminals corresponding to the plurality of electronic component packages, and a retainer for retaining the plurality of sets of external connecting terminals, the wafer including a plurality of pre-base portions that will be separated from one another later so that each of them will thereby become the base; and a plurality of electronic component chips bonded to the plurality of pre-base portions of the wafer.

In the substructure of the invention, the wafer may further incorporate a plurality of chip bonding conductor layers to each of which the at least one electronic component chip is to be bonded, the plurality of chip bonding conductor layers being disposed in the plurality of pre-base portions, respectively.

In the substructure of the invention, the wafer may further incorporate a plurality of sets of terminal conductor layers to which the at least one electronic component chip is to be electrically connected, the plurality of sets of terminal conductor layers being connected to the plurality of sets of external connecting terminals.

In the substructure of the invention, the wafer may further incorporate: a plurality of sets of terminal conductor layers to which the at least one electronic component chip is to be electrically connected, the plurality of sets of terminal conductor layers being connected to the plurality of sets of external connecting terminals; and a plurality of chip bonding conductor layers to each of which the at least one electronic component chip is to be bonded, the plurality of chip bonding conductor layers being disposed in the plurality of pre-base portions, respectively.

In the substructure of the invention, the electronic component chip may incorporate a plurality of electrodes, and the electronic component package comprises a plurality of terminal connecting portions each of which connects at least one of the electrodes and at least one of the external connecting terminals to each other. In this case, the substructure further incorporates a plurality of sets of terminal connecting portions corresponding to the plurality of electronic component packages.

Each of the pre-base portions may have a top surface, the top surface including: a chip bonding surface to which the at least one electronic component chip is to be bonded; and connecting surfaces of the external connecting terminals to which the terminal connecting portions are to be connected, the connecting surfaces being located higher than the chip bonding surface.

The electronic component package may incorporate a plurality of electronic component chips and may further incorporate at least one inter-chip connecting portion for electrically connecting electrodes of the plurality of electronic component chips to one another. In addition, the substructure may further incorporate a plurality of inter-chip connecting portions corresponding to the plurality of electronic component packages.

The substructure of the invention may further incorporate a sealer for sealing the electronic component chip.

In the substructure of the invention, the retainer may incorporate: a base forming portion disposed in each of the pre-base portions; and a portion to be removed made of a material different from a material of the base forming portion and disposed around each of the pre-base portions, each of the external connecting terminals extending across the base forming portion and the portion to be removed.

According to the method of manufacturing an electronic component package of the invention, there is fabricated the wafer incorporating the plurality of sets of external connecting terminals and the retainer for retaining the plurality of sets of external connecting terminals, the wafer including the plurality of pre-base portions that will be separated from one another later so that each of them will thereby become the base of the electronic component package. The at least one electronic component chip is then bonded to each of the pre-base portions of the wafer. The wafer is then cut so that the pre-base portions are separated from one another and a plurality of bases are thereby formed. According to the method of manufacturing an electronic component package of the invention, it is possible to mass-produce electronic component packages at low costs in a short period of time and to respond to alterations to specifications flexibly and quickly.

According to the method of manufacturing an electronic component package of the invention, the wafer may further incorporate a plurality of sets of terminal conductor layers to which at least one electronic component chip is to be electrically connected, the plurality of sets of terminal conductor layers being connected to the plurality of sets of external connecting terminals. In this case, it is possible to electrically connect the external connecting terminals and the electronic component chips to each other with precision.

In the method of manufacturing an electronic component package of the invention, each of the pre-base portions may have a top surface, the top surface including: the chip bonding surface to which the at least one electronic component chip is to be bonded; and the connecting surfaces of the external connecting terminals to which the terminal connecting portions are to be connected, the connecting surfaces being located higher than the chip bonding surface. In this case, it is possible to easily connect the electronic component chip bonded to the chip bonding surface and the external connecting terminals to each other through the terminal connecting portions.

In the method of manufacturing an electronic component package of the invention, the retainer may incorporate: the base forming portion disposed in each of the pre-base portions; and the portion to be removed made of a material different from a material of the base forming portion and disposed around each of the pre-base portions, each of the external connecting terminals extending across the base forming portion and the portion to be removed, and the method may further include the step of removing the portion to be removed after the step of bonding the electronic component chip to each of the pre-base portions. In this case, it is easy to manufacture electronic component packages each having such a structure that a portion of each of the plurality of external connecting terminals protrudes from the side surface of the base.

According to the wafer for electronic component packages or the method of manufacturing the same of the invention, it is possible to mass-produce electronic component packages at low costs in a short period of time and to respond to alterations to specifications flexibly and quickly.

The wafer for electronic component packages of the invention may incorporate a plurality of sets of terminal conductor layers to which at least one electronic component chip is to be electrically connected, the plurality of sets of terminal conductor layers being connected to the plurality of sets of external connecting terminals. In this case, it is possible to electrically connect the external connecting terminals and the electronic component chip to each other with precision.

In the wafer of the invention, each of the pre-base portions may have a top surface, the top surface including: the chip bonding surface to which the at least one electronic component chip is to be bonded; and the connecting surfaces of the external connecting terminals to which the terminal connecting portions are to be connected, the connecting surfaces being located higher than the chip bonding surface. In this case, it is possible to easily connect the electronic component chip bonded to the chip bonding surface and the external connecting terminals to each other.

In the wafer of the invention, the retainer may incorporate: the base forming portion disposed in each of the pre-base portions; and the portion to be removed made of a material different from a material of the base forming portion and disposed around each of the pre-base portions, each of the external connecting terminals extending across the base forming portion and the portion to be removed. In this case, it is easy to manufacture electronic component packages each having such a structure that a portion of each of the plurality of external connecting terminals protrudes from the side surface of the base.

According to the substructure for electronic component packages of the invention, it is possible to mass-produce electronic component packages at low costs in a short period of time and to respond to alterations to specifications flexibly and quickly.

In the substructure of the invention, the wafer may incorporate a plurality of sets of terminal conductor layers to which at least one electronic component chip is to be electrically connected, the plurality of sets of terminal conductor layers being connected to the plurality of sets of external connecting terminals. In this case, it is possible to electrically connect the external connecting terminals and the electronic component chip to each other with precision.

In the substructure of the invention, each of the pre-base portions may have a top surface, the top surface including: the chip bonding surface to which the at least one electronic component chip is to be bonded; and the connecting surfaces of the external connecting terminals to which the terminal connecting portions are to be connected, the connecting surfaces being located higher than the chip bonding surface. In this case, it is possible to easily connect the electronic component chip bonded to the chip bonding surface and the external connecting terminals to each other through the terminal connecting portions.

In the substructure of the invention, the retainer may incorporate: the base forming portion disposed in each of the pre-base portions; and the portion to be removed made of a material different from a material of the base forming portion and disposed around each of the pre-base portions, each of the external connecting terminals extending across the base forming portion and the portion to be removed. In this case, it is easy to manufacture electronic component packages each having such a structure that a portion of each of the plurality of external connecting terminals protrudes from the side surface of the base.

Other and further objects, features and advantages of the invention will appear more fully from the following description.

DETAILED DESCRIPTION OF THE PREFERRED EMBODIMENTS

First Embodiment

Preferred embodiments of the invention will now be described in detail with reference to the accompanying drawings. Reference is now made to FIG. 1 to FIG. 4 to describe outlines of a method of manufacturing an electronic component package, a wafer for electronic component packages, and a substructure for electronic component packages of a first embodiment of the invention.

The method of manufacturing an electronic component package of the first embodiment is a method of manufacturing an electronic component package incorporating a base having a plurality of external connecting terminals, and at least one electronic component chip bonded to the base and electrically connected to at least one of the plurality of external connecting terminals.

Figure 1:
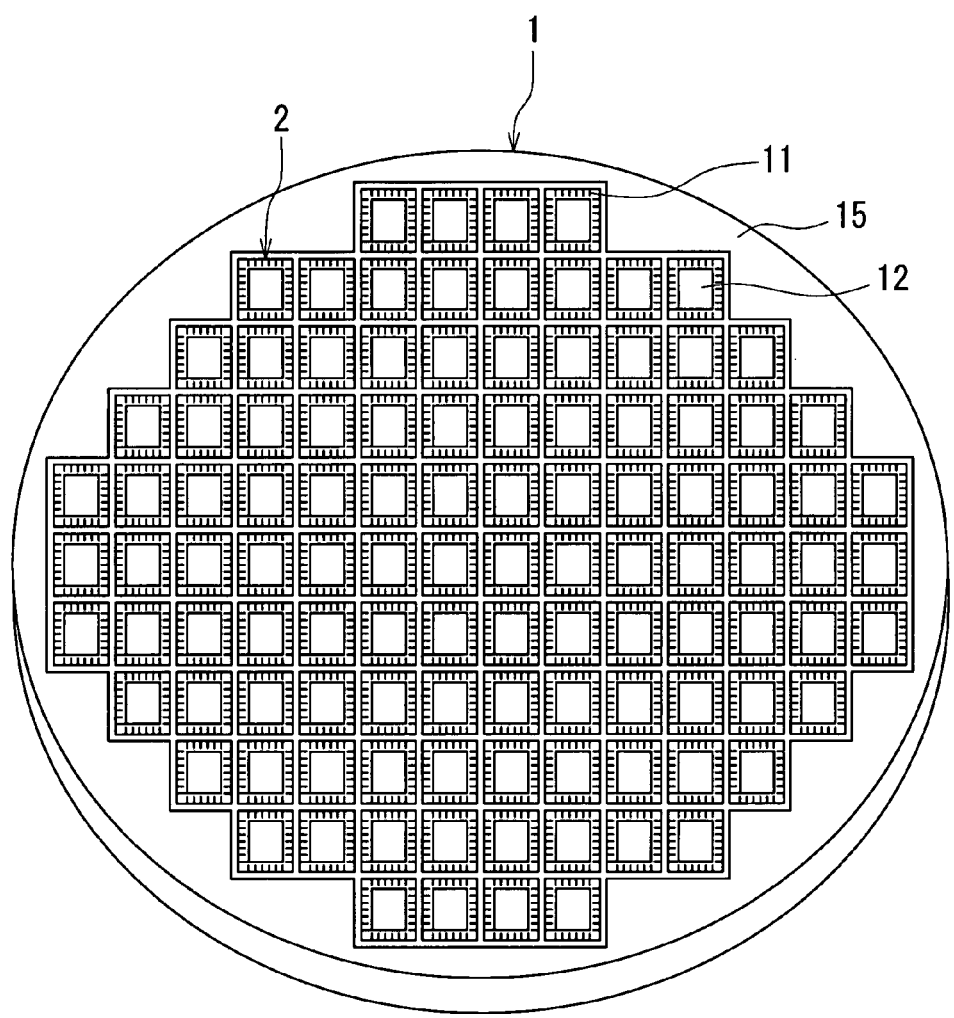
FIG. 1 is a view for illustrating a wafer for electronic component packages of a first embodiment of the invention.

FIG. 1 illustrates a first step of the method of manufacturing the electronic component package of the embodiment. In this step a wafer for electronic component packages of the embodiment (which is hereinafter simply called a wafer) 1 is fabricated. The wafer 1 incorporates: a plurality of sets of external connecting terminals 11 corresponding to a plurality of electronic component packages; and a retainer 15 for retaining the plurality of sets of external connecting terminals 11. The wafer 1 does not include any circuit element. The wafer 1 includes a plurality of pre-base portions 2 that will be separated from one another later to thereby become the bases of the electronic component packages. As shown in FIG. 1, the pre-base portions 2 are arranged such that a plurality of portions 2 are respectively aligned in vertical and horizontal directions. In FIG. 1, a plurality of short straight lines drawn inside each of the rectangles representing the pre-base portions 2 all represent the external connecting terminals 11. FIG. 1 illustrates an example in which the wafer 1 is circular-plate-shaped. However, the wafer 1 may have any shape, and may be shaped like a plate whose bottom and top surfaces are rectangular, for example.

The wafer 1 of FIG. 1 further incorporates a plurality of chip bonding conductor layers 12 respectively disposed in the plurality of pre-base portions 2. At least one electronic component chip is to be bonded to each of the chip bonding conductor layers 12. However, it is not necessarily required that the wafer 1 incorporate the chip bonding conductor layers 12.

Figure 2:
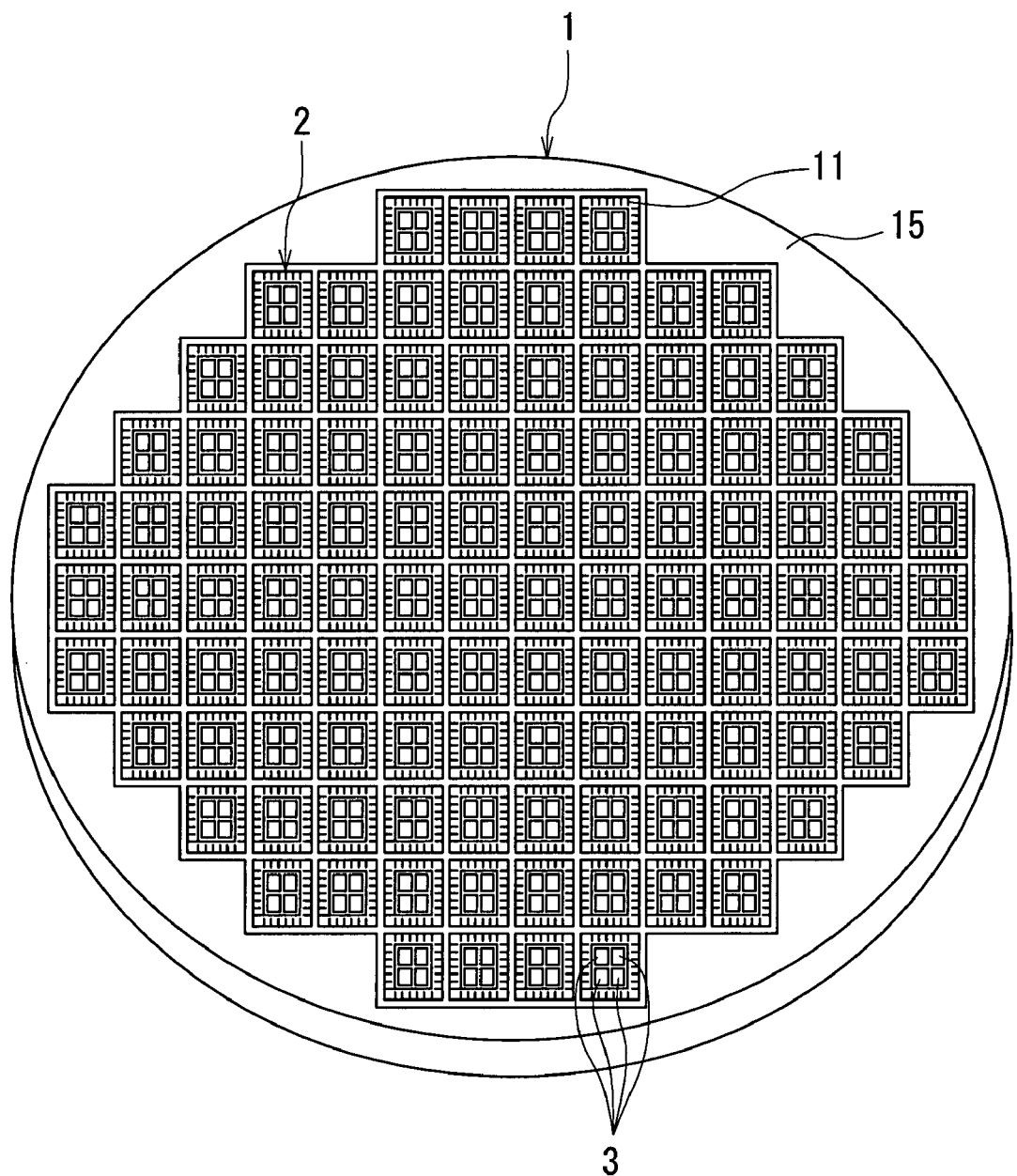
FIG. 2 is a view for illustrating a method of manufacturing an electronic component package of the first embodiment of the invention.

FIG. 2 illustrates the following step. In the step, at least one electronic component chip (hereinafter simply called a chip) 3 is bonded to each of the pre-base portions 2 of the wafer 1. FIG. 2 shows an example in which four chips 3 are bonded to each of the pre-base portions 2. However, the number of chips 3 bonded to each of the pre-base portions 2 may be arbitrarily chosen. Furthermore, although not shown in FIG. 2, each of the chips 3 has a plurality of electrodes. The chips 3 may be semiconductor integrated circuit elements or other circuit elements, or may be sensors or actuators formed by using the micro-electro mechanical systems (MEMS), for example.

Figure 3:
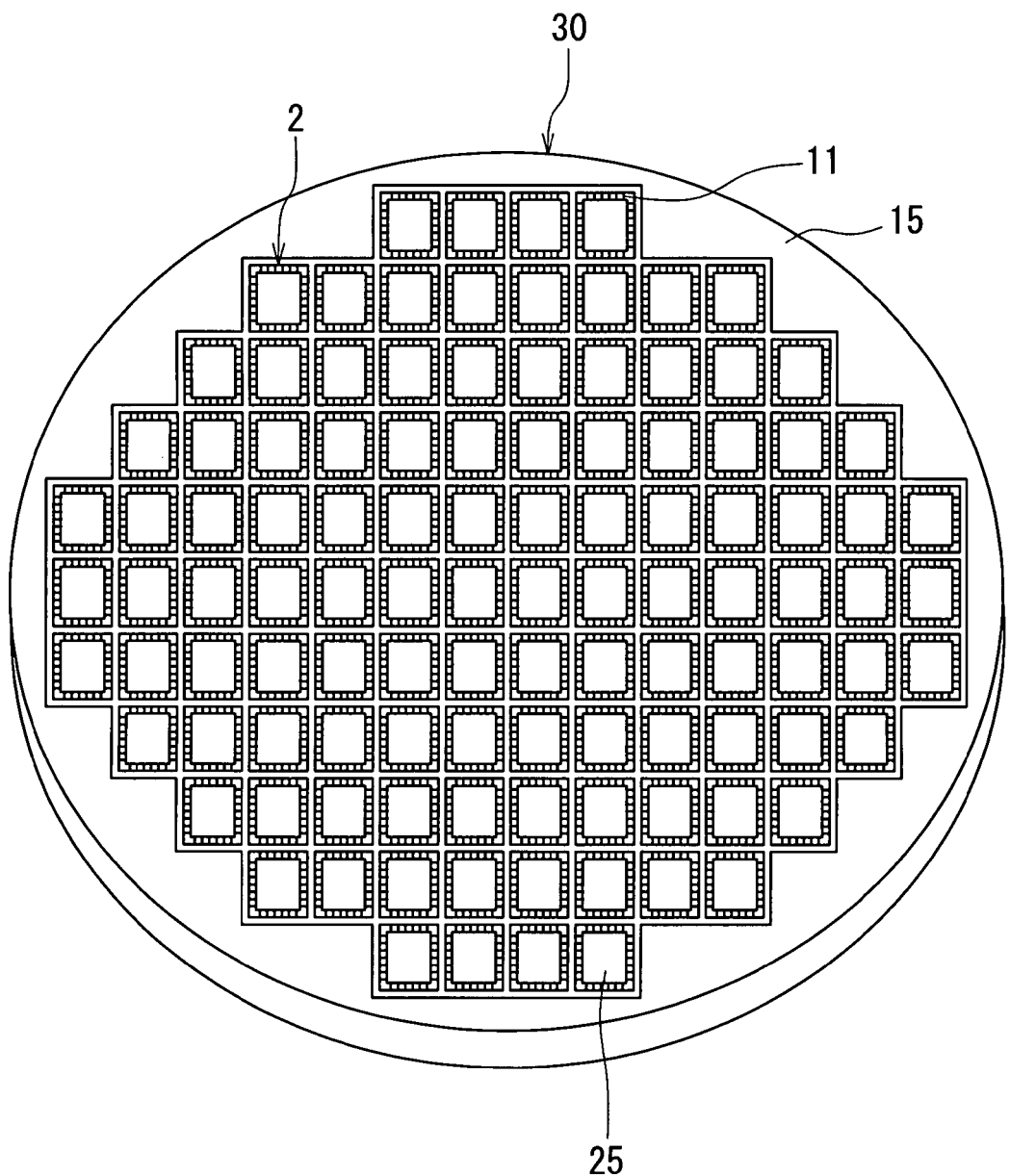
FIG. 3 is a view for illustrating a substructure for electronic component packages of the first embodiment of the invention.

FIG. 3 illustrates the following step. In the step, first, although not shown, a plurality of terminal connecting portions are formed for each of the pre-base portions 2, each of the terminal connecting portions electrically connecting at least one electrode and at least one external connecting terminal 11 to each other. Alternatively, for example, flip-chip may be employed to directly connect the electrodes of the chips 3 to the external connecting terminal 11, instead of using the terminal connecting portions to connect therethrough the electrodes of the chips 3 to the external connecting terminal 11.

In a case in which a plurality of chips 3 are disposed in each one of the pre-base portions 2, at least one inter-chip connecting portion may be formed for each one of the pre-base portions 2 as required to electrically connect the plurality of chips 3 to one another. The inter-chip connecting portion is formed at the same time as the terminal connecting portions, for example.

Next, sealers 25 for sealing the chips 3 are formed. FIG. 3 shows an example in which individual sealers 25 are formed for the respective pre-base portions 2. However, a single sealer 25 may be formed for sealing all the chips 3 of all the pre-base portions 2. If it is not required for the electronic component package to seal the chips 3, it is not necessary to form the sealer 25.

The layered structure fabricated through the steps illustrated in FIG. 1 to FIG. 3 is a substructure for electronic component packages (hereinafter simply called a substructure) 30 of the embodiment. The substructure 30 incorporates at least the wafer 1 and the plurality of chips 3. The substructure 30 may further incorporate the terminal connecting portions, the inter-chip connecting portions and the sealers 25.

Figure 4:
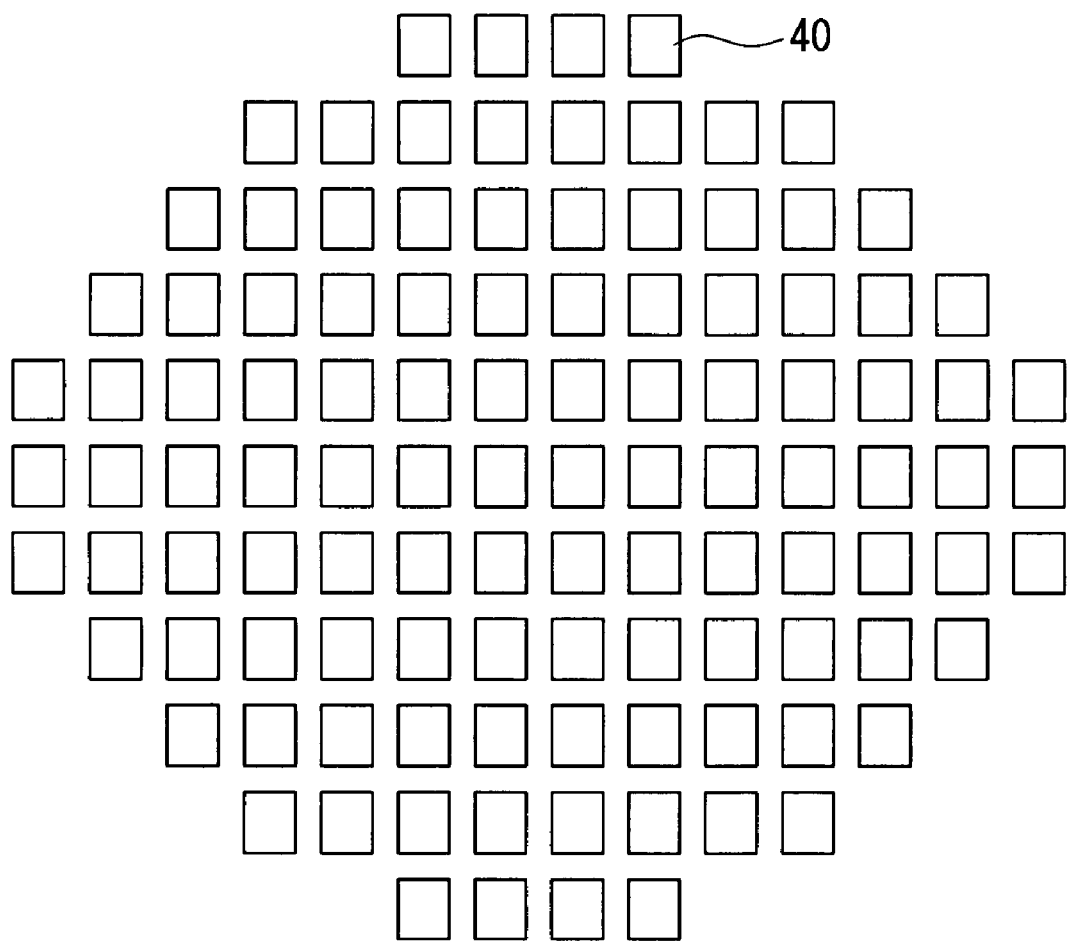
FIG. 4 is a view for illustrating a method of manufacturing the electronic component package of the first embodiment of the invention.

FIG. 4 illustrates the following step. In the step, the substructure 30 including the wafer 1 is cut so that the pre-base portions 2 are separated from one another and a plurality of bases are thereby formed. As a result, there are formed a plurality of electronic component packages 40 each of which incorporates the base and at least one electronic component chip 3.

Figure 5:
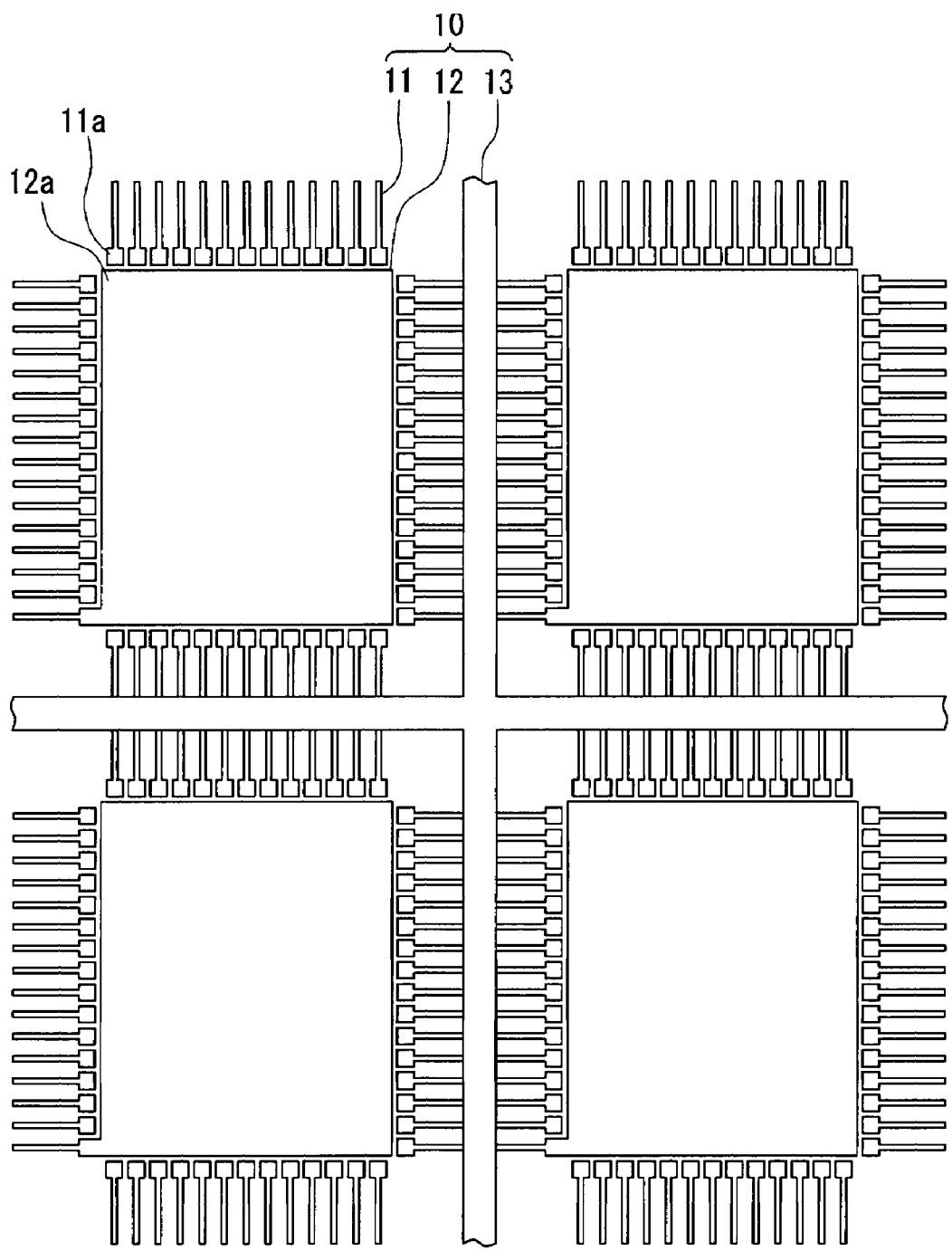
FIG. 5 is a top view of part of a lead frame used in the first embodiment of the invention.

Reference is now made to FIG. 5 to FIG. 20 to describe a method of manufacturing the electronic component package of the embodiment in detail. In the method, as previously described, the wafer 1 is first fabricated. The step of fabricating the wafer 1 will now be described with reference to FIG. 5 to FIG. 7. Here is given an example in which the wafer 1 is fabricated through the use of a lead frame. FIG. 5 is a top view of part of the lead frame 10. In the step of fabricating the wafer 1, the lead frame 10 is first fabricated. The lead frame 10 includes: a plurality of sets of external connecting terminals 11 corresponding to a plurality of electronic component packages; a plurality of chip bonding conductor layers 12 corresponding to the plurality of electronic component packages; and a coupling portion 13 for coupling the external connecting terminals 11 and the chip bonding conductor layers 12. The lead frame 10 is fabricated through a typical fabricating method. For example, the lead frame 10 may be fabricated by stamping a sheet metal through the use of a die, or may be fabricated by patterning a sheet metal by etching.

Each of the external connecting terminals 11 has an end connected to the coupling potion 13, and the other end facing the perimeter of the chip bonding conductor layers 12 with a specific space created in between. In a portion near the other end of each of the external connecting terminals 11, there is formed a connecting surface 11a to which the terminal connecting portion that will be formed later is to be connected. The top surface of each of the chip bonding conductor layers 12 is a chip bonding surface 12a to which at least one electronic component chip 3 is to be bonded.

Figure 6:
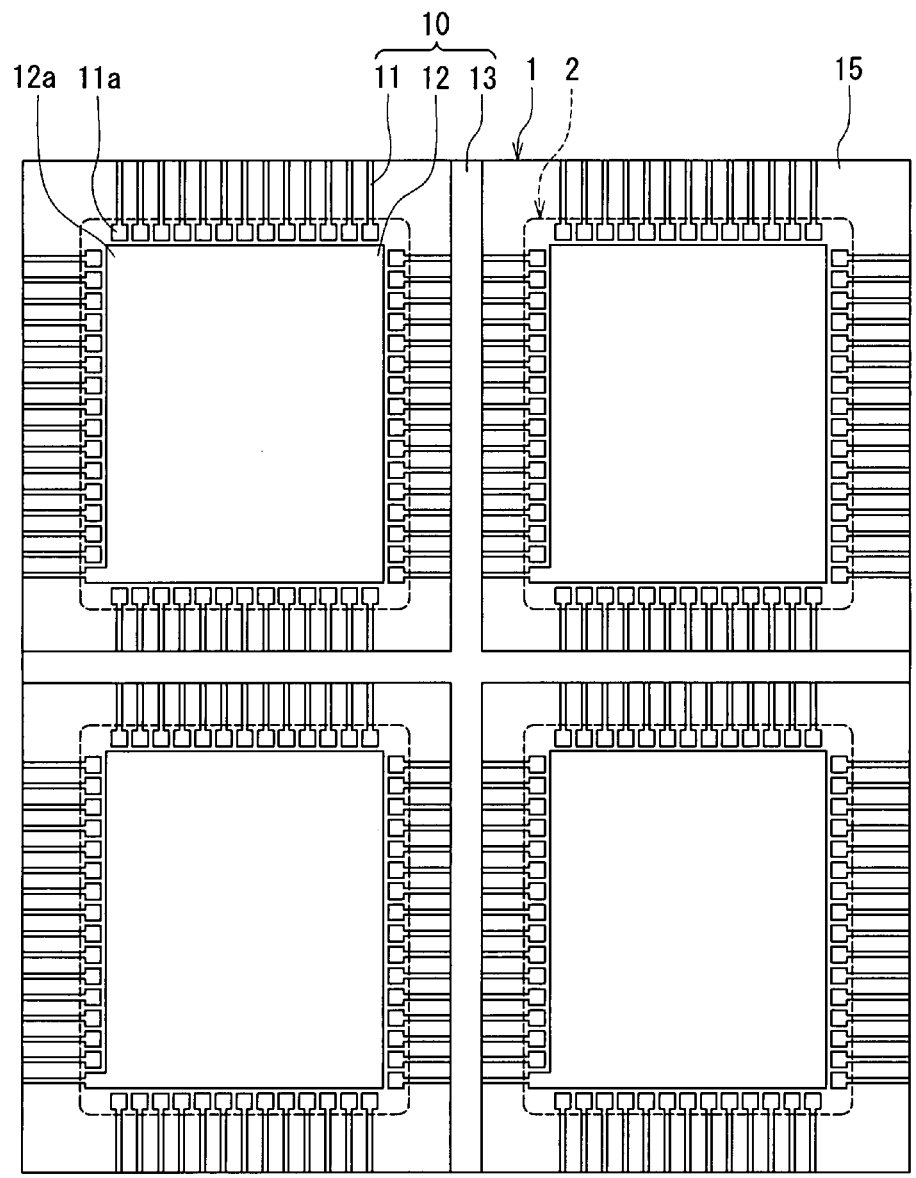
FIG. 6 is a top view of part of the wafer for electronic component packages of the first embodiment of the invention.
Figure 7:
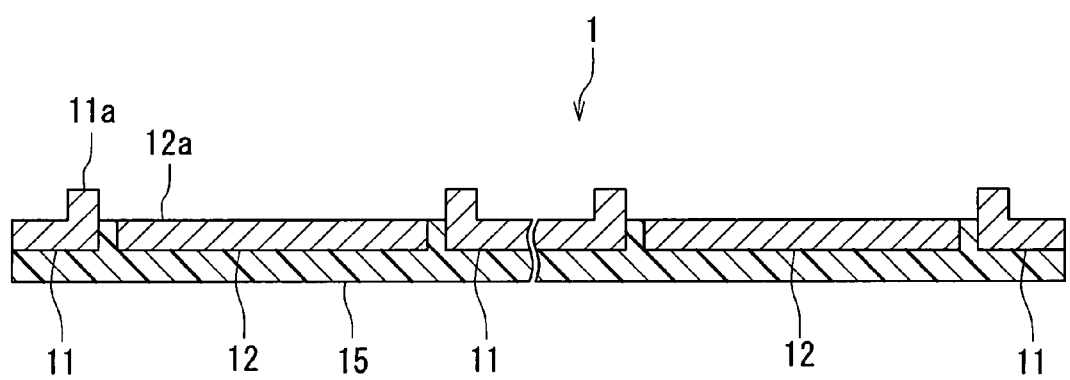
FIG. 7 is a cross-sectional view of part of the wafer for electronic component packages of FIG. 6.

FIG. 6 and FIG. 7 illustrate the following step. FIG. 6 is a top view of part of the wafer 1. FIG. 7 is a cross-sectional view of the part of the wafer 1. In the step, the wafer 1 is fabricated by integrating the lead frame 10 and the retainer 15 with each other. The retainer 15 is made of an insulating material or a high-resistance material. The material of the retainer 15 is a resin or a ceramic, for example. There are a variety of methods for integrating the lead frame 10 and the retainer 15 with each other. For example, one possible method is that the lead frame 10 is embedded in a sheet made of an uncured resin that will be the retainer 15 later, and then the resin is cured to integrate the lead frame 10 and the retainer 15 made of the resin with each other. Another method is that an unbaked ceramic material that will be the retainer 15 later and the lead frame 10 are shaped as one, and then the ceramic material is baked to integrate the lead frame 10 and the retainer 15 made of the ceramic with each other. Still another method is that the lead frame 10 is attached to the retainer 15 formed in the shape of a plate in advance to integrate the lead frame 10 and the retainer 15 with each other. In this case, the retainer 15 formed in the shape of a plate may be made of a resin or a ceramic, or may be made of a combination of a substrate made of a semiconductor material such as silicon and an insulating film formed on the substrate.

The wafer 1 includes the plurality of pre-base portions 2. Each of the pre-base portions 2 has a top surface which includes the chip bonding surface 12a and the connecting surface 11a of each of the external connecting terminals 11. In the example of FIG. 7, a portion of the external connecting terminal 11 facing the perimeter of the chip bonding conductor layer 12 is bent upward. The top surface of this portion bent upward is the connecting surface 11a. Therefore, the connecting surface 11a is located higher than the chip bonding surface 12a. In the case of fabricating the chip 3 by using a semiconductor wafer having a diameter of 200 mm or 300 mm, the thickness of the chip 3 may be nearly equal to the thickness of such a semiconductor wafer. In the case in which the chip 3 is fabricated by using a semiconductor wafer, the thickness of the chip 3 may be reduced by polishing and thereby thinning the semiconductor wafer. In the case in which the chip 3 is fabricated by using a semiconductor wafer, the thickness of the chip 3 is within a range of 30 to 800 µm, for example, but may be greater than 800 µm. It is preferred that the thickness of the chip 3 be within a range of 30 to 250 µm. The difference in level between the connecting surface 11a and the chip bonding surface 12a is preferably equal to or nearly equal to the thickness of the chip 3. However, if the thickness of the chip 3 is great, this difference in level may be smaller than the thickness of the chip 3.

Although it is not absolutely necessary to provide the chip bonding conductor layers 12, it is preferred to provide them because of the reason that will now be described. First, if the chip bonding conductor layers 12 are not provided, the chips 3 are directly bonded to the retainer 15 made of a resin or a ceramic, for example. In this case, it is impossible to bond the chips 3 to the retainer 15 through the use of solder. In contrast, if the chip bonding conductor layers 12 are provided, it is easy to bond the chips 3 to the chip bonding conductor layers 12 through the use of solder. Furthermore, in the case in which the chip bonding conductor layers 12 are provided, it is possible to connect the chips 3 to the ground by using the chip bonding conductor layers 12 as the ground. It is thereby possible to achieve advantages such as a reduction in noise produced in the chips 3.

Figure 8:
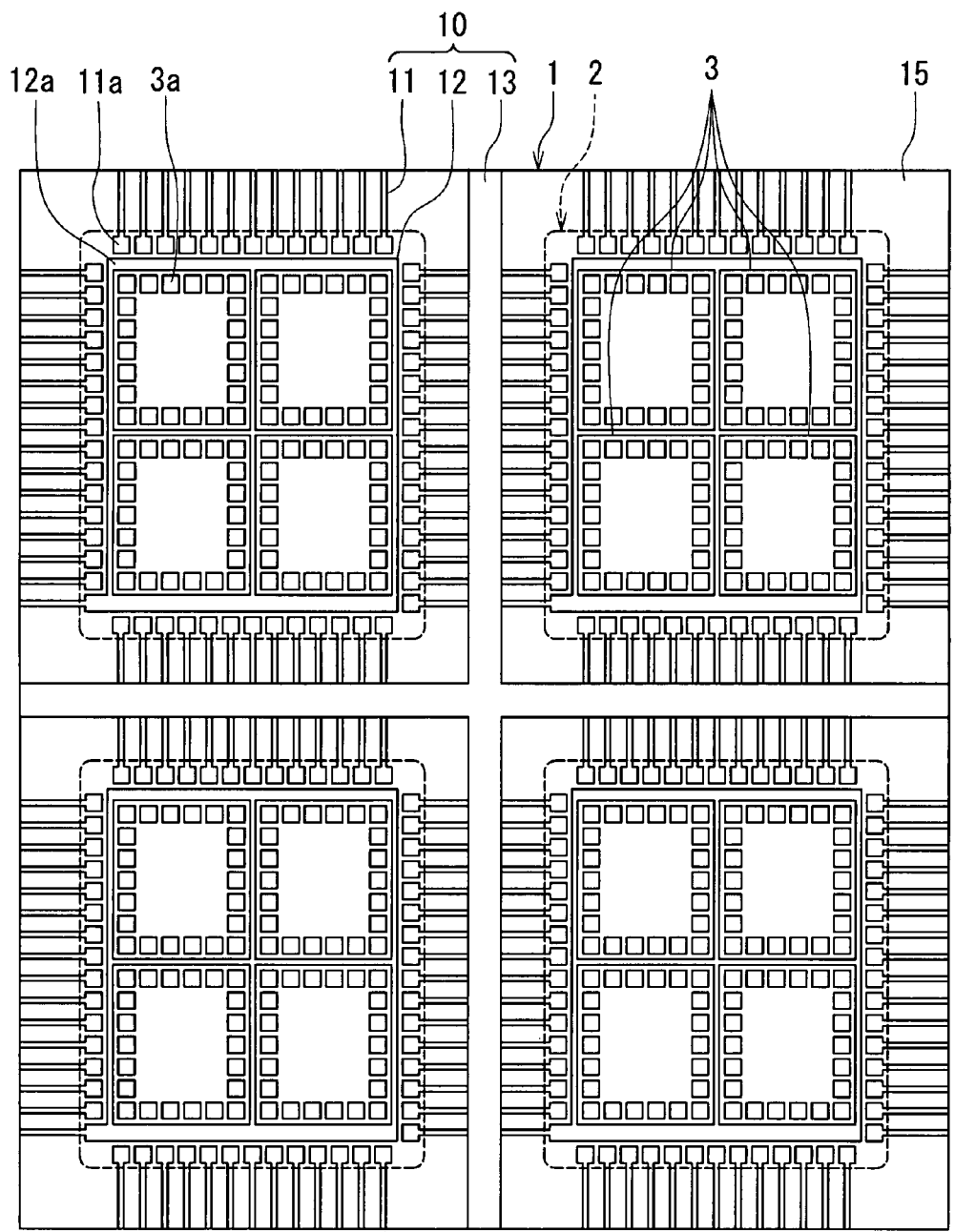
FIG. 8 is a top view of part of a layered structure obtained in the manufacturing process of the electronic component package of the first embodiment of the invention.
Figure 9:
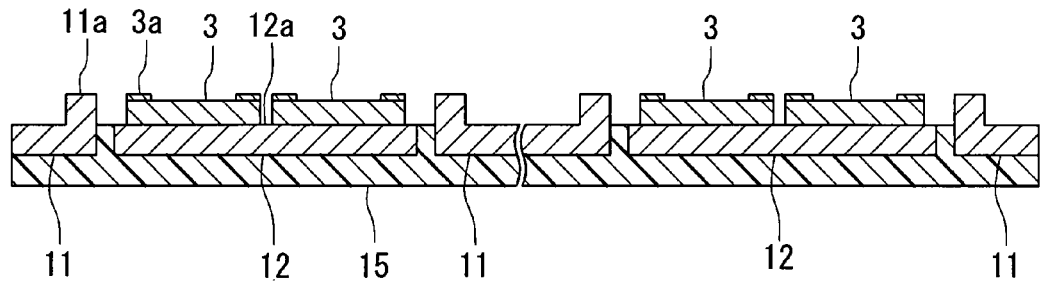
FIG. 9 is a cross-sectional view of part of the layered structure shown in FIG. 8.

FIG. 8 and FIG. 9 illustrate the following step. FIG. 8 is a top view of part of a layered structure fabricated in the manufacturing process of the electronic component package. FIG. 9 is a cross-sectional view of part of the layered structure. In the step, at least one chip 3 is bonded to the chip bonding surface 12a of each of the pre-base portions 2. FIG. 8 and FIG. 9 illustrate an example in which four chips 3 are bonded to one chip bonding surface 12a. Each of the chips 3 has a top surface, a bottom surface, and a plurality of electrodes 3a disposed on the top surface. Each of the chips 3 is disposed so that the bottom surface is bonded to the chip bonding surface 12a. The top surface of each of the electrodes 3a is located at the same height or nearly the same height as the connecting surfaces 11a.

Figure 10:
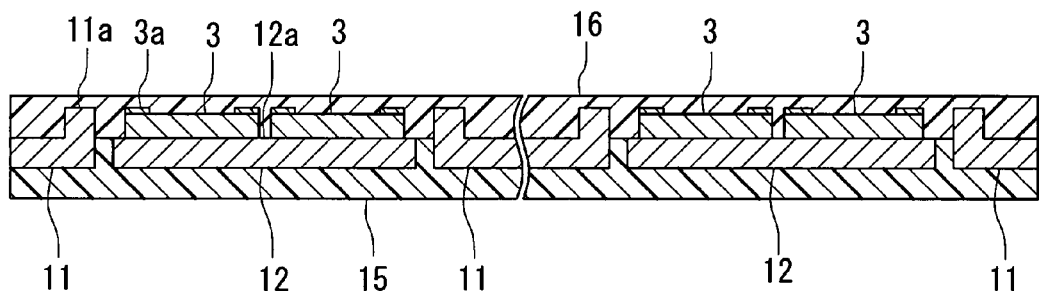
FIG. 10 is a cross-sectional view of part of the layered structure obtained in a step that follows the step shown in FIG. 9.

Next, the step of forming the terminal connecting portions and the inter-chip connecting portions is performed. This step will now be described with reference to FIG. 10 to FIG. 14. FIG. 10 to FIG. 13 are cross-sectional views each illustrating part of the layered structure. FIG. 14 is a top view of part of the layered structure. In the step, as shown in FIG. 10, an insulating layer 16 is first formed to cover the entire top surface of the layered structure shown in FIG. 9. The insulating layer 16 covers the wafer 1 and the chips 3, and has a flattened top surface. The material of the insulating layer 16 is a resin, for example. To be specific, the material of the insulating layer 16 may be a polyimide resin or photoresist.

Figure 11:
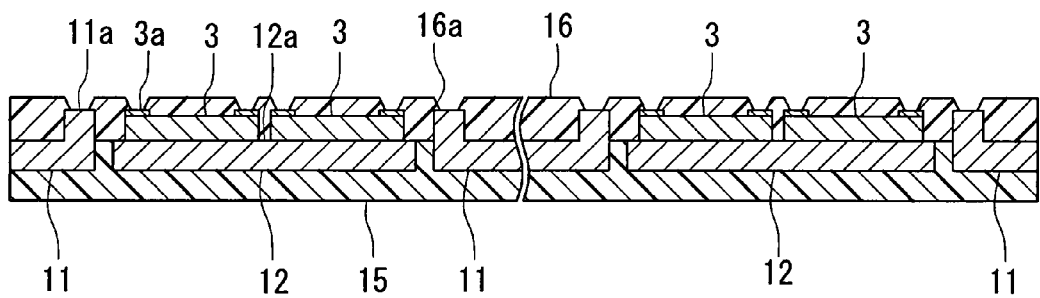
FIG. 11 is a cross-sectional view of part of the layered structure obtained in a step that follows the step shown in FIG. 10.

Next, as shown in FIG. 11, openings (via holes) 16a for exposing the connecting surface 11a and the electrodes 3a are respectively formed in a portion of the insulating layer 16 located above the connecting surface 11a and a portion of the insulating layer 16 located above the electrodes 3a. In a case in which the insulating layer 16 is made of a photosensitive material such as photoresist or a polyimide resin containing a sensitizer, it is possible to form the openings 16a in the insulating layer 16 by photolithography. In a case in which the insulating layer 16 is not made of a photosensitive material, it is possible to form the openings 16a in the insulating layer 16 by selectively etching the insulating layer 16.

Figure 12:
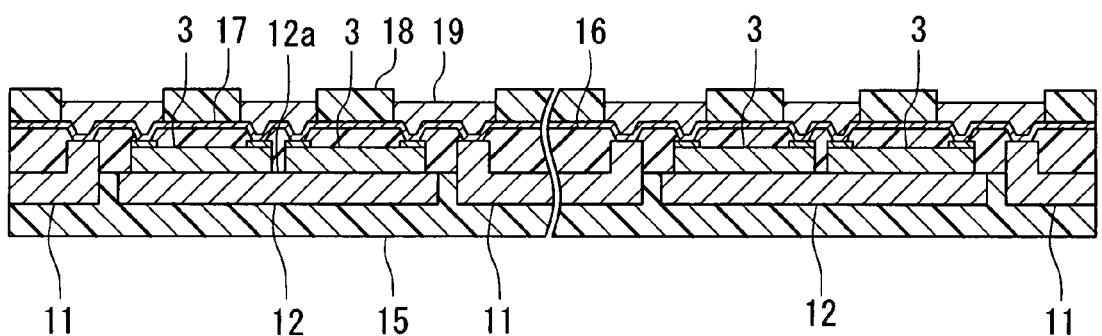
FIG. 12 is a cross-sectional view of part of the layered structure obtained in a step that follows the step shown in FIG. 11.

Next, as shown in FIG. 12, a seed layer 17 for plating is formed by sputtering, for example, to cover the entire top surface of the layered structure. The seed layer 17 has a thickness within a range of 50 to 120 nm inclusive, for example. The seed layer 17 may be made of Cu, Ni, Cr, Fe or Au, for example. Next, a frame 18 for plating is formed on the seed layer 17 by photolithography. The frame 18 has openings formed in regions where the terminal connecting portions and the inter-chip connecting portions are to be formed. Next, a plating layer 19 is formed by frame plating in the openings of the frame 18. The plating layer 19 may be made of a material that can be formed by plating, such as Cu, Ni, Cr, Fe or Au. Among these materials, Cu or Au that has an excellent conductivity is preferred as the material of the plating layer 19.

Figure 13:
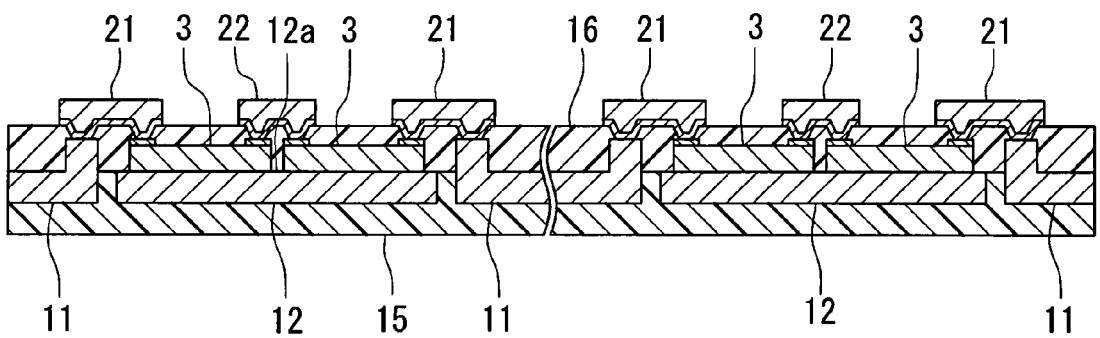
FIG. 13 is a cross-sectional view of part of the layered structure obtained in a step that follows the step shown in FIG. 12.
Figure 14:
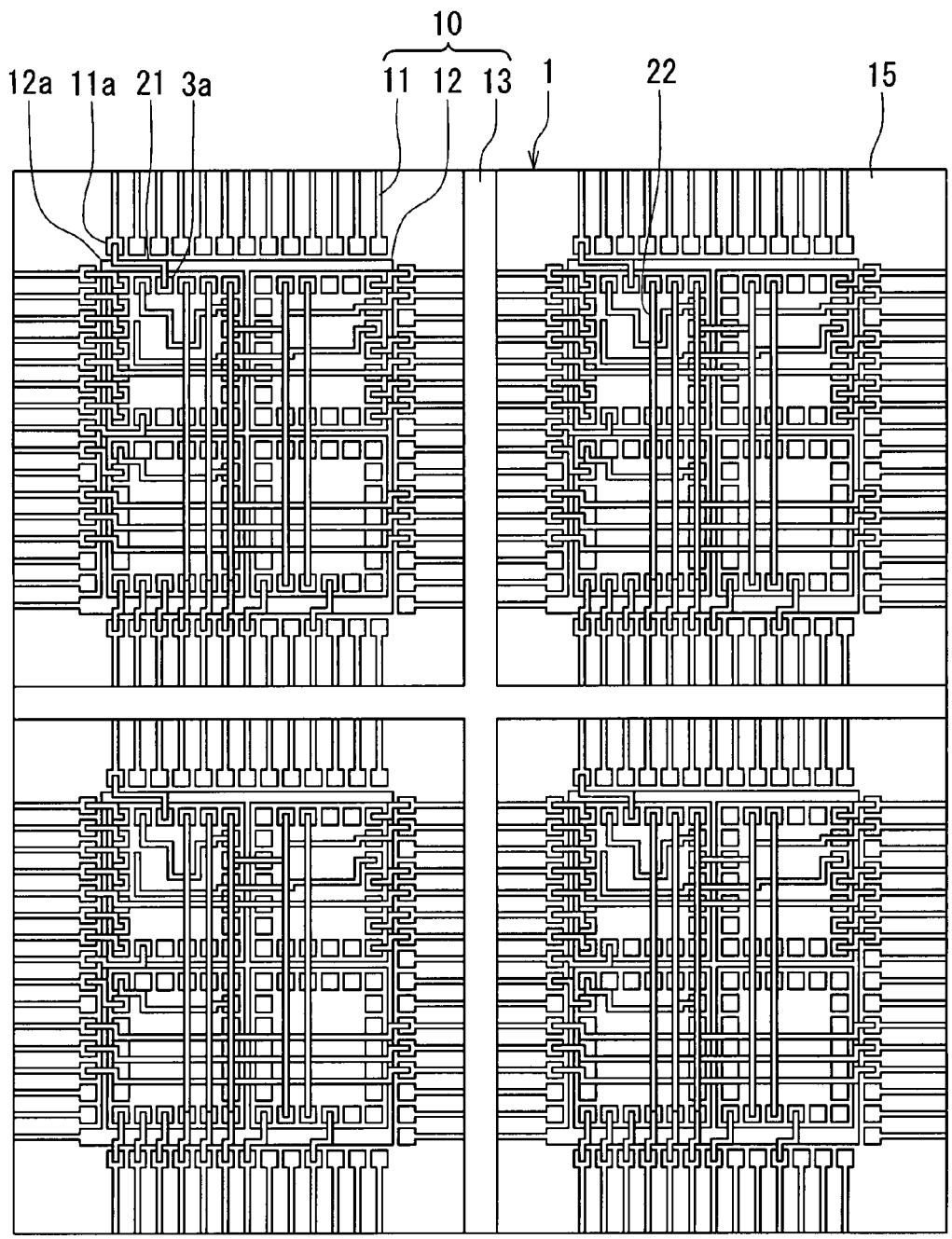
FIG. 14 is a top view of part of the layered structure shown in FIG. 13.

Next, as shown in FIG. 13 and FIG. 14, after the frame 18 is removed, the seed layer 17 except portions located below the plating layer 19 is removed using the plating layer 19 as a mask. As a result, the terminal connecting portions 21 and the inter-chip connecting portions 22 are formed of the remaining seed layer 17 and plating layer 19 at the same time, such that portions of the terminal connecting portions 21 and the inter-chip connecting portions 22 are inserted to the respective openings 16a. In FIG. 14 the insulating layer 16 is omitted. When the terminal connecting portions 21 and the inter-chip connecting portions 22 are formed, connecting portions for connecting different ones of the electrodes of each of the chips 3 to one another or connecting portions for connecting different ones of the external connecting terminals 11 to one another may be formed at the same time.

Figure 15:
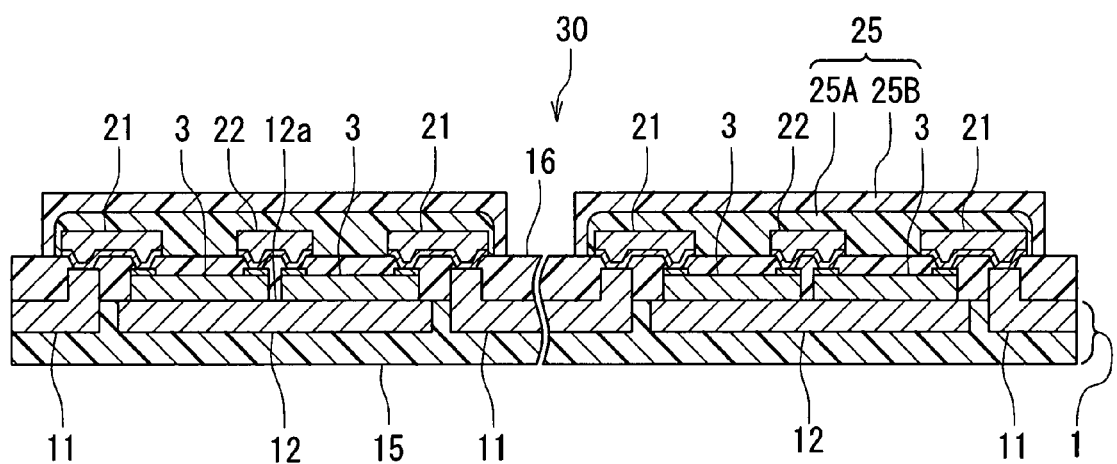
FIG. 15 is a cross-sectional view of part of the layered structure obtained in a step that follows the step shown in FIG. 13.
Figure 16:
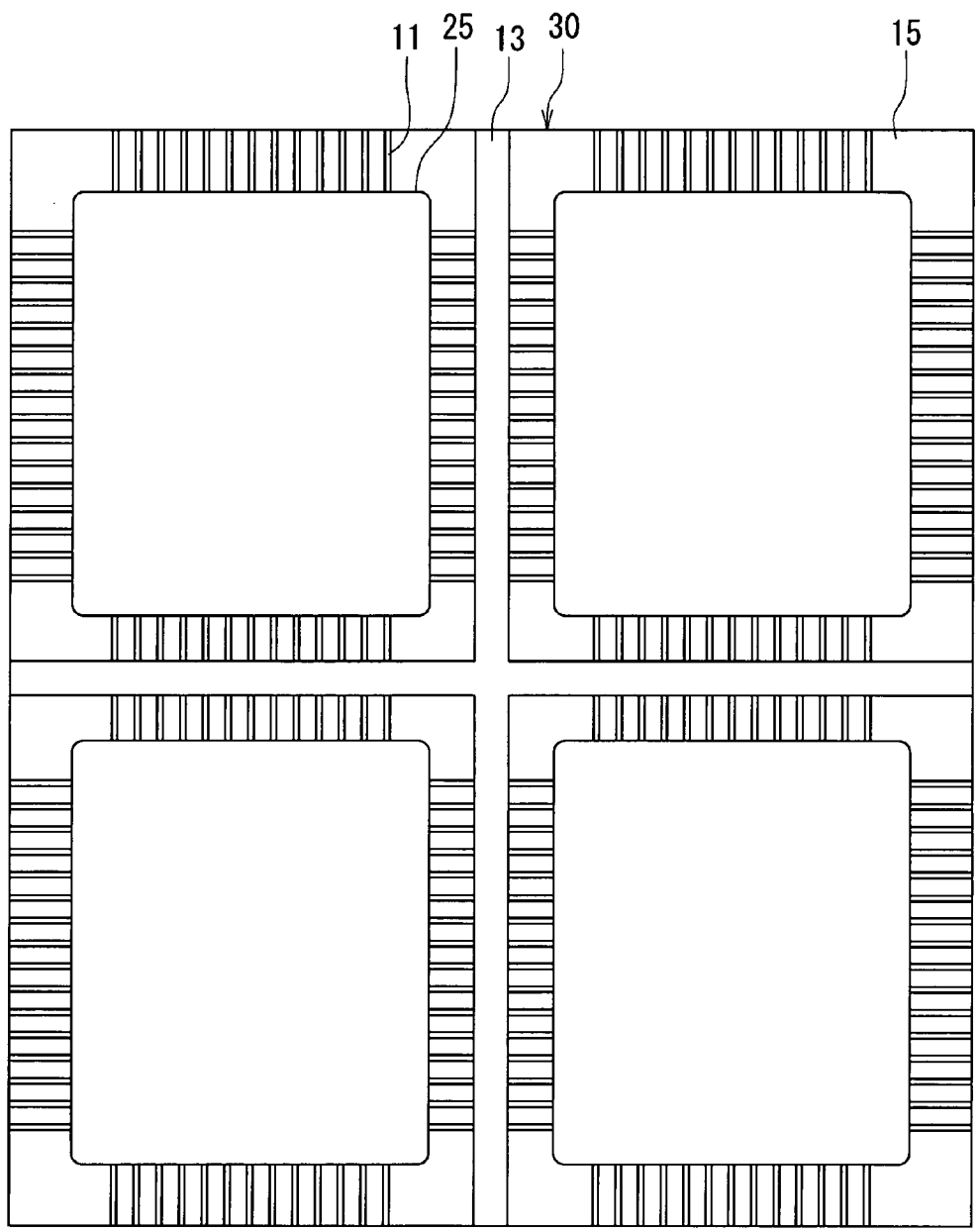
FIG. 16 is a top view of part of the layered structure shown in FIG. 15.

Next, the step of forming the sealer 25 is performed. This step will now be described with reference to FIG. 15 and FIG. 16. FIG. 15 is a cross-sectional view of part of the layered structure. FIG. 16 is a top view of part of the layered structure. In FIG. 16 the insulating layer 16 is omitted. In the step, first, a first resin layer 25A is formed to cover the terminal connecting portions 21 and the inter-chip connecting portions 22. Next, a second resin layer 25B is formed to cover the first resin layer 25A. Before forming the first resin layer 25A, a passivation film may be formed, if necessary, to cover the terminal connecting portions 21 and the inter-chip connecting portions 22. The second resin layer 25B may be made of a typical mold resin. The first resin layer 25A is provided for preventing damage to the chips 3, the terminal connecting portions 21 and the inter-chip connecting portions 22 resulting from a stress generated by the second resin layer 25B. The first resin layer 25A is made of a silicone resin, for example. The sealer 25 for sealing the chips 3 is formed of the first resin layer 25A and the second resin layer 25B. FIG. 15 and FIG. 16 show an example in which individual sealers 25 are formed for the respective pre-base portions 2. However, a single sealer 25 may be formed to seal all the chips 3 of all the pre-base portions 2.

The substructure 30 is fabricated through the series of steps shown in FIG. 5 to FIG. 16. The substructure 30 incorporates the wafer 1, the plurality of chips 3, the plurality of terminal connecting portions 21, the plurality of inter-chip connecting portions 22, and the plurality of sealers 25.

Figure 17:
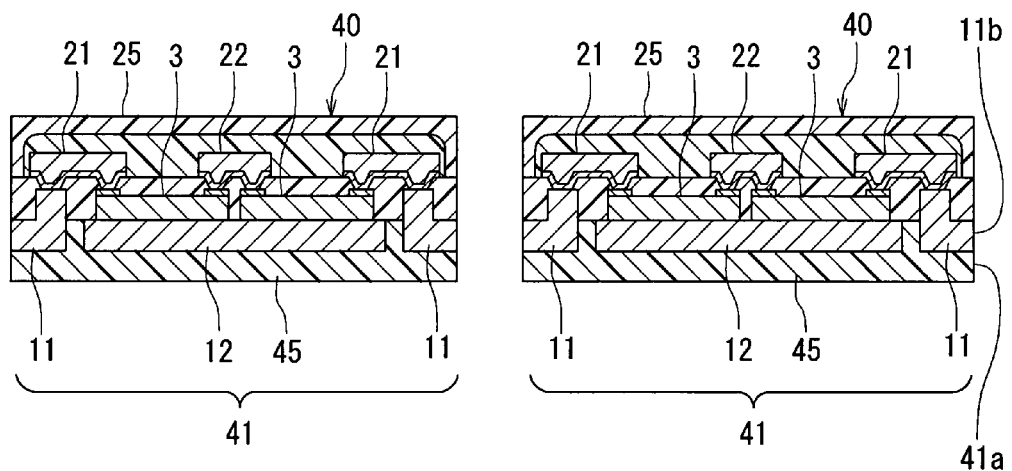
FIG. 17 is a cross-sectional view of part of the layered structure obtained in a step that follows the step shown in FIG. 15.

FIG. 17 is a cross-sectional view for illustrating the following step. In the step, the substructure 30 including the wafer 1 is cut so that the pre-base portions 2 are separated from one another and a plurality of bases 41 are thereby formed. As a result, a plurality of electronic component packages 40 each of which incorporates the base and at least one chip 3 are formed. The wafer 1 is cut so that the coupling portion 13 of the lead frame 10 is removed. Each of the bases 41 includes a plurality of external connecting terminals 11, one chip bonding conductor layer 12, and a retainer 45 for retaining the terminals 11 and the conductor layer 12. The retainer 45 is formed by cutting the retainer 15 of the wafer 1. Each of the electronic component packages 40 further incorporates a plurality of terminal connecting portions 21 and the sealer 25. If each of the electronic component packages 40 incorporates a plurality of chips 3, the electronic component package 40 may further incorporate at least one inter-chip connecting portion 22.

Figure 18:
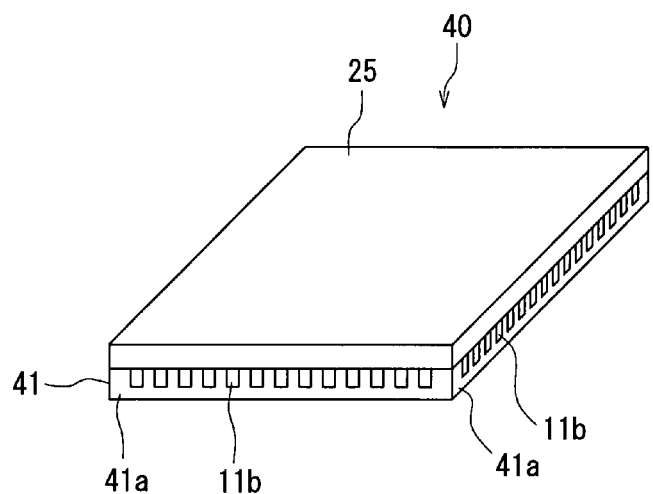
FIG. 18 is a perspective view of the electronic component package of the first embodiment of the invention.

FIG. 18 is a perspective view illustrating an appearance of the electronic component package 40. As shown in FIG. 18, the electronic component package 40 is rectangular-solid-shaped, for example. In this case, the base 41 has four side surfaces 41a. At the side surfaces 41a, the end faces 11b of the plurality of external connecting terminals 11 are exposed.

Figure 19:
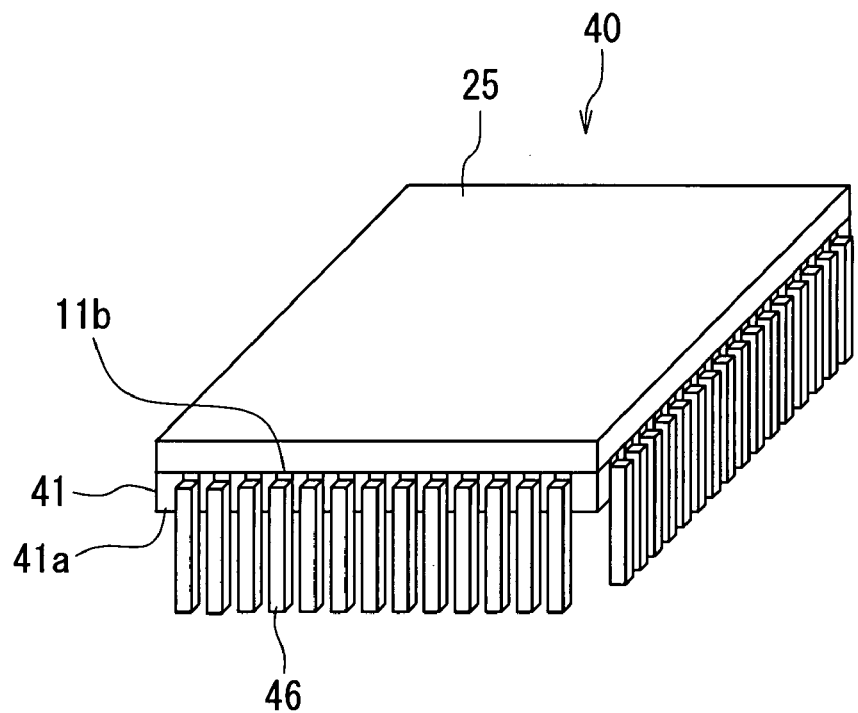
FIG. 19 is a perspective view illustrating another configuration of the electronic component package of the first embodiment of the invention.

FIG. 19 is a perspective view illustrating another configuration of the electronic component package 40. Although the electronic component package 40 may have the configuration shown in FIG. 18, the electronic component package 40 may further incorporate a plurality of terminal pins 46 respectively connected to the external connecting terminals 11. In this case, the method of manufacturing the electronic component package 40 further includes the step of connecting the pins 46 to the end faces 11b of the external connecting terminals 11 after the step of cutting the substructure 30 including the wafer 1.

Figure 20:
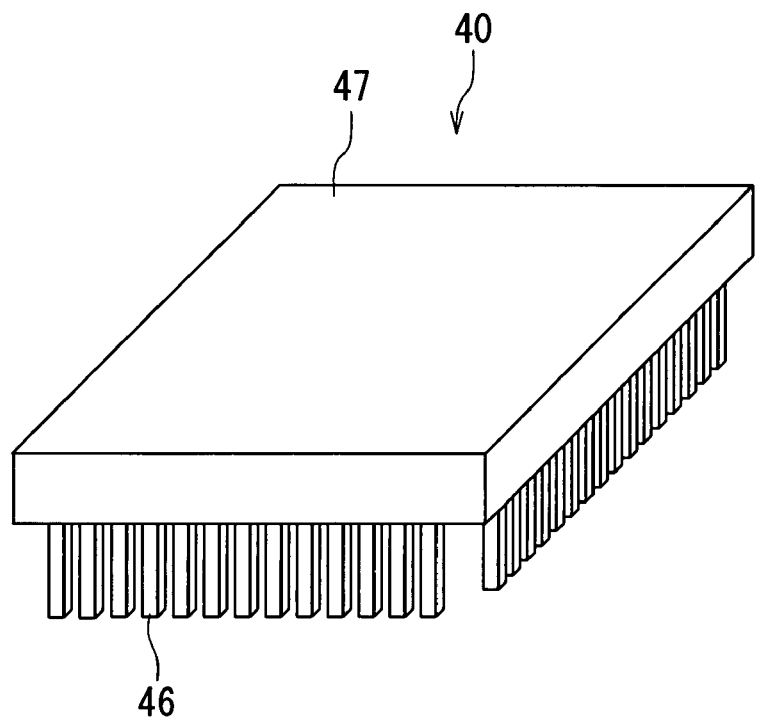
FIG. 20 is a perspective view illustrating still another configuration of the electronic component package of the first embodiment of the invention.

FIG. 20 is a perspective view illustrating still another configuration of the electronic component package 40. In addition to the configuration show in FIG. 19, the electronic component package 40 of FIG. 20 further incorporates a protection layer 47 for covering the connecting portions between the external connecting terminals 11 and the terminal pins 46. The protection layer 47 is made of a resin, for example. The protection layer 47 reinforces the connecting portions between the external connecting terminals 11 and the terminal pins 46.

Reference is now made to FIG. 21 to FIG. 25 to describe first to third methods of forming a difference in level between the connecting surface of each of the external connecting terminals 11 and the chip bonding surface.

Figure 21:
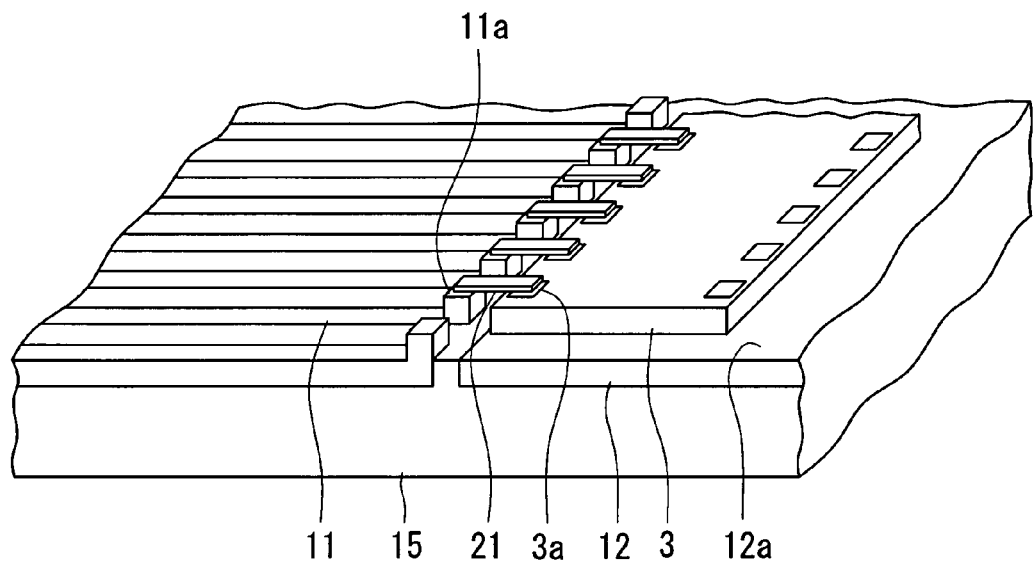
FIG. 21 is a perspective view illustrating terminal connecting portions and a neighborhood thereof of the first embodiment of the invention.

The first method will now be described with reference to FIG. 21. FIG. 21 is a perspective view illustrating the terminal connecting portions 21 and a neighborhood thereof. In the first method, as previously described, the portion of each of the external connecting terminals 11 facing the perimeter of the chip bonding conductor layer 12 is bent upward, and the top surface of this portion is the connecting surface 11a. As a result, a difference in level is formed between the connecting surface 11a and the chip bonding surface 12a. The top surfaces of the electrodes 3a of the chip 3 are located at the same height or nearly the same height as the connecting surfaces 11a.

Figure 22:
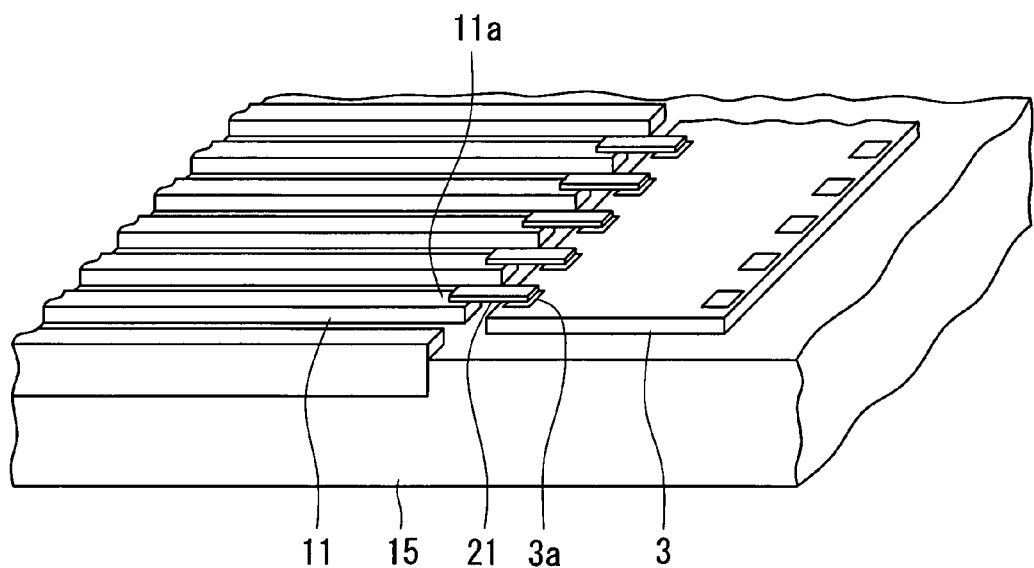
FIG. 22 is a perspective view illustrating the terminal connecting portions and the neighborhood thereof of the first embodiment of the invention.
Figure 23:
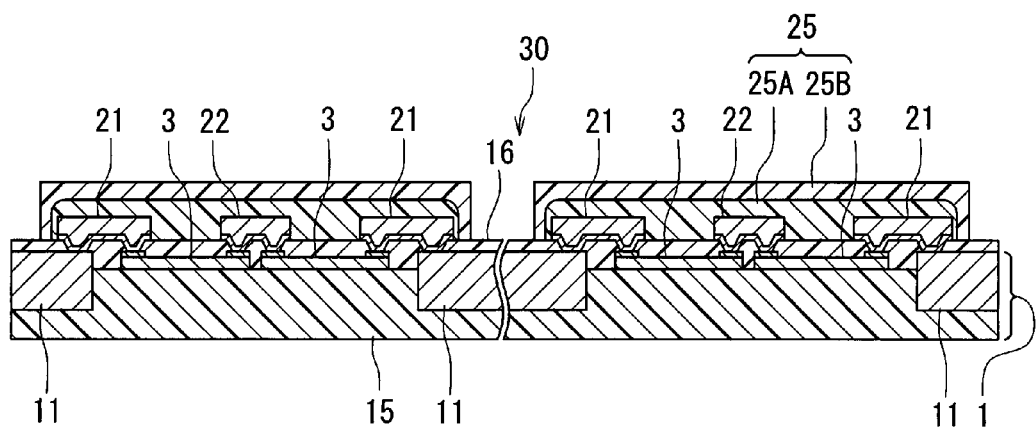
FIG. 23 is a cross-sectional view of the substructure of the first embodiment of the invention.

The second method will now be described with reference to FIG. 22 and FIG. 23. FIG. 22 is a perspective view illustrating the terminal connecting portions 21 and a neighborhood thereof. FIG. 23 is a cross-sectional view of the substructure 30. In the second method the wafer 1 incorporates no chip bonding conductor layer 12, and the chips 3 are bonded to the top surface of the retainer 15. Therefore, in the second method, a portion of the top surface of the retainer 15 surrounded by the plurality of external connecting terminals 11 is the chip bonding surface. In the second method a portion of each of the external connecting terminals 11 near an end thereof close to the chip bonding surface is not bent upward. Therefore, in the second method, this portion of the top surface of the external connecting terminal 11 is the connecting surface 11a. In the second method a difference in level is formed between the top surface of the external connecting terminal 11 and the chip bonding surface that is part of the top surface of the retainer 15, so that the top surface of the external connecting terminal 11 is located higher than the chip bonding surface. This difference in level may be formed by polishing the surface of the wafer 1 including the top surfaces of the external connecting terminals 11 and the top surface of the retainer 15 wherein the retainer 15 is made of a material that is softer than the metal forming the external connecting terminals 11, such as a resin. That is, in this case, a greater portion of the retainer 15 than the external connecting terminals 11 is removed by polishing, and the above-mentioned difference in level is thereby created. Alternatively, the difference in level may be formed by selectively etching the top surface of the retainer 15 by dry etching. It is also possible through the second method that the top surfaces of the electrodes 3a of the chip 3 are located at the same height or nearly the same height as the connecting surfaces 11a.

Figure 24:
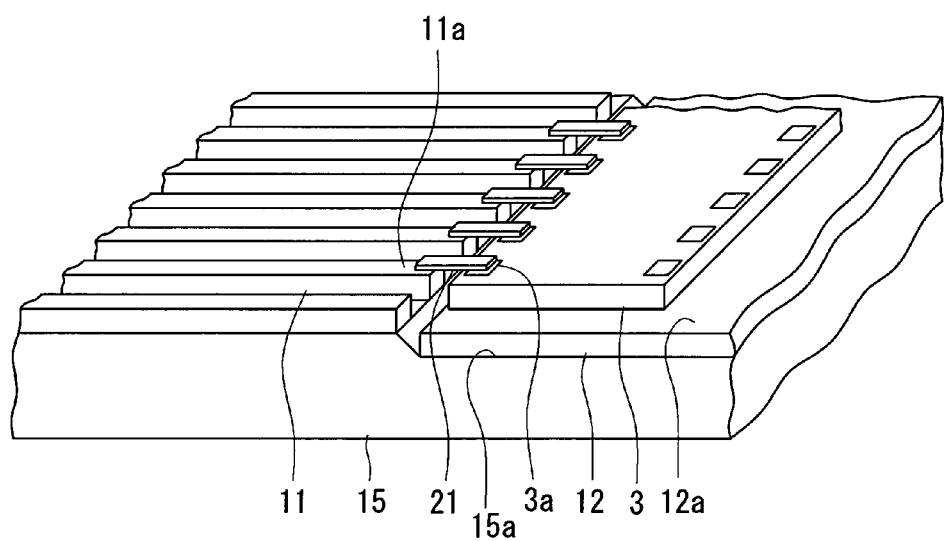
FIG. 24 is a perspective view illustrating the terminal connecting portions and the neighborhood thereof of the first embodiment of the invention.
Figure 25:
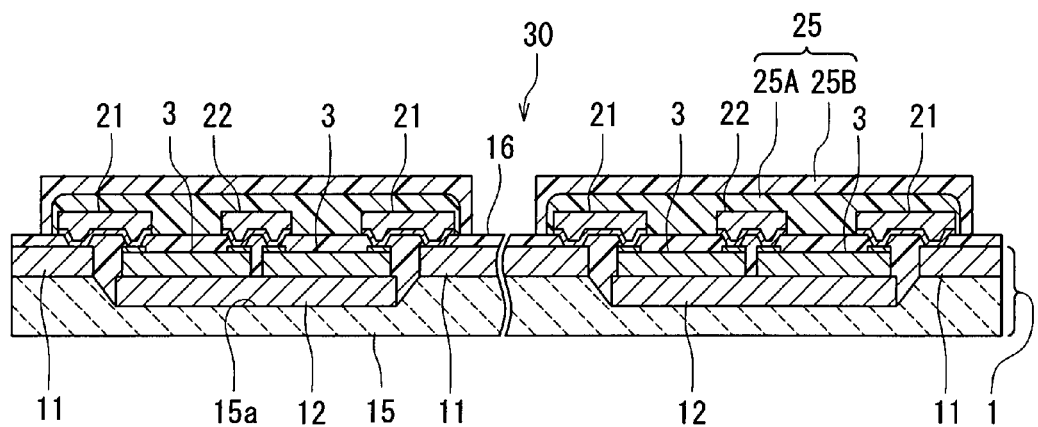
FIG. 25 is a cross-sectional view of the substructure of the first embodiment of the invention.

The third method will now be described with reference to FIG. 24 and FIG. 25. FIG. 24 is a perspective view illustrating the terminal connecting portions 21 and a neighborhood thereof. FIG. 25 is a cross-sectional view of the substructure 30. In the third method a portion of each of the external connecting terminals 11 facing the perimeter of the chip bonding conductor layer 12 is not bent upward. Therefore, in the third method, a portion of the top surface of each of the external connecting terminals 11 near the perimeter of the chip bonding conductor layer 12 is the connecting surface 11a. In the third method, a concave portion 15a is formed in a portion of the top surface of the retainer 15 where the chip bonding conductor layer 12 is to be disposed. The retainer 15 is made of a ceramic, for example. It is preferred that the depth of the concave portion 15a be equal to or nearly equal to the thickness of the chip 3. In the third method the chip bonding conductor layer 12 is placed in the concave portion 15a, and the top surface of the chip bonding conductor layer 12 is the chip bonding surface 12a. It is also possible through the third method that the top surfaces of the electrodes 3a of the chip 3 are located at the same height or nearly the same height as the connecting surfaces 11a.

Figure 26:
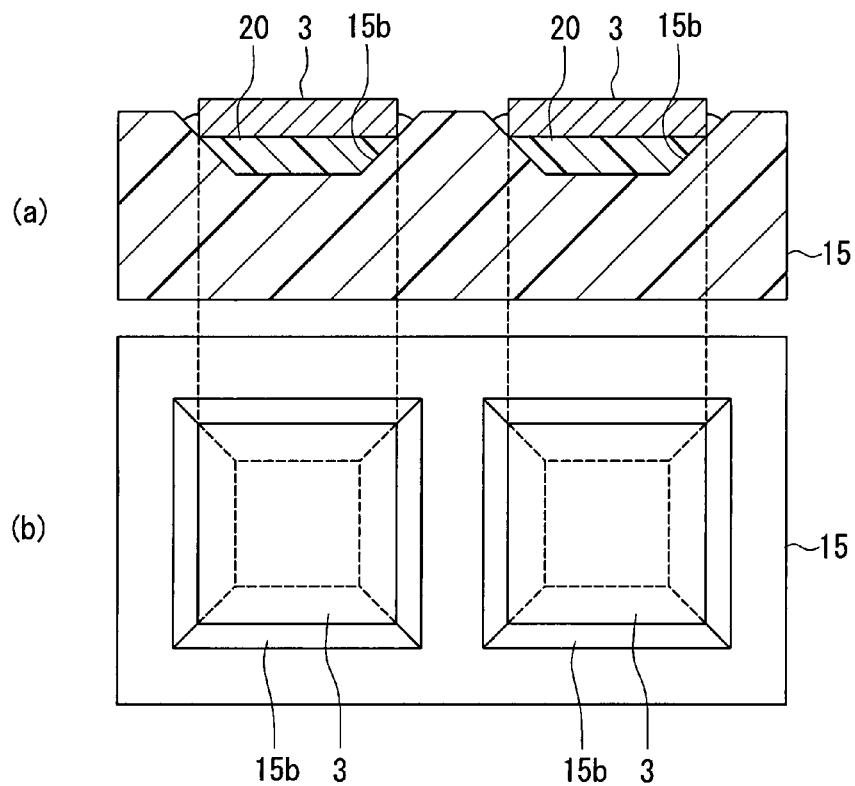
FIG. 26 is a view for illustrating a method of positioning a chip with respect to the wafer with accuracy in the first embodiment of the invention.

Reference is now made to FIG. 26 to describe a method of positioning the chips 3 with respect to the wafer 1 with accuracy. FIG. 26 illustrates portions of the retainer 15 and the chips 3 bonded to each other. FIG. 26(a) shows a cross section of the retainer 15 and the chips 3. FIG. 26(b) shows the top surfaces of the retainer 15 and the chips 3. In this method, concave portions 15b are formed in the top surface of the retainer 15 for accommodating the chips 3. It is possible to form the concave portions 15b with accuracy through the use of photolithography, for example. Each of the chip 3 is rectangular-solid-shaped. Each of the concave portions 15b has a shape of quadrangular prismoid in which the opening located at the top surface of the retainer 15 is greater than the bottom surface. In the concave portion 15b the opening is greater than the top surface of the chip 3, and the bottom surface is smaller than the top surface of the chip 3. The shapes of the opening and the bottom surface are geometrically similar to the shape of the top surface of the chip 3. To bond the chips 3 to the retainer 15 of FIG. 16, first, the concave portions 15b are filled with an adhesive 20. Next, the chips 3 are placed in the concave portions 15b. The chips 3 are placed such that the top surfaces thereof are parallel to the top surface of the retainer 15 except the concave portions 15b. As shown in FIG. 26, each of the chips 3 is positioned in contact with the four oblique surfaces of the concave portion 15b. The adhesive 20 is then hardened, and the chips 3 are thereby bonded to the retainer 15. Through this method, it is possible to easily position the chips 3 with respect to the retainer 15 of the wafer 1 with accuracy by forming the four side surfaces of each chip with accuracy.

Figure 27:
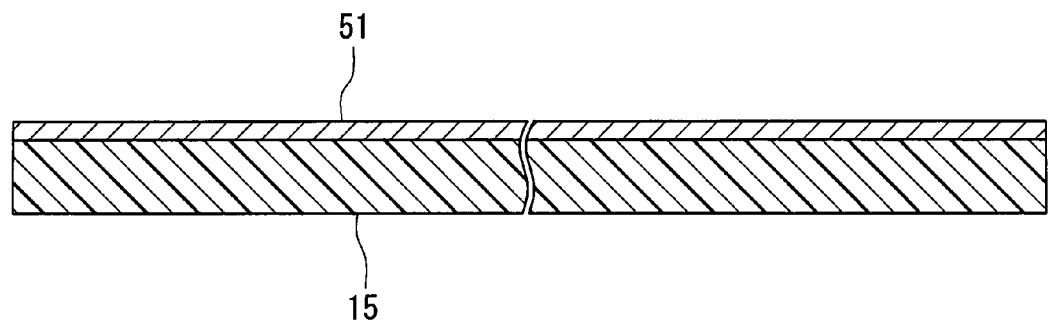
FIG. 27 is a cross-sectional view for illustrating an example of method of fabricating the wafer for electronic component packages of the first embodiment of the invention.
Figure 28:
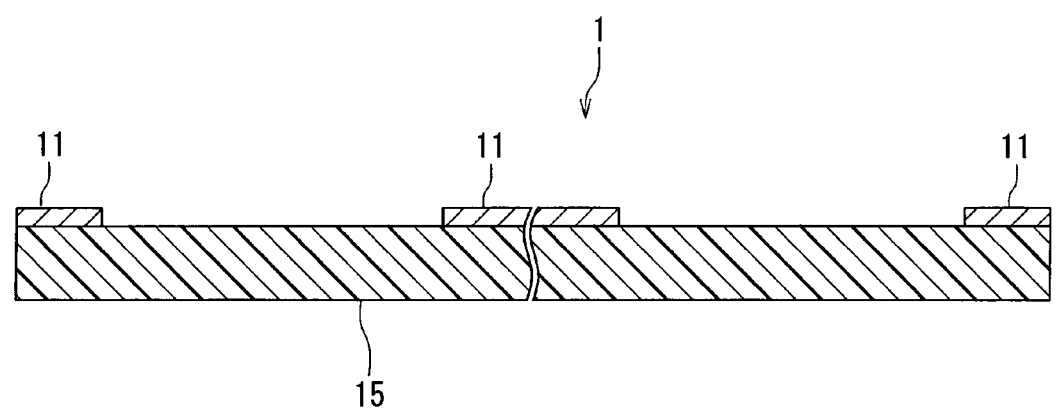
FIG. 28 is a cross-sectional view for illustrating the example of method of fabricating the wafer for electronic component packages of the first embodiment of the invention.

First and second examples of a method of fabricating the wafer 1 without using any lead frame will now be described. Reference is now made to FIG. 27 and FIG. 28 to describe the first example. FIG. 27 and FIG. 28 are cross-sectional views for describing the first example. In the first example, first, a conductor layer 51 is formed on the plate-shaped retainer 15, as shown in FIG. 27. The conductor layer 51 may be formed by attaching a foil made of a metal, such as copper, silver, gold or aluminum, to the top surface of the retainer 15. Alternatively, the conductor layer 51 may be formed by forming a plating film on the entire top surface of the retainer 15 by plating.

In the following step of the first example, as shown in FIG. 28, the conductor layer 51 is patterned so that a plurality of sets of external connecting terminals 11 are formed of the remaining conductor layer 15. Alternatively, the conductor layer 51 may be patterned so that a plurality of sets of external connecting terminals 11 and a plurality of chip bonding conductor layers 12 are formed of the remaining conductor layer 15. For example, the patterning of the conductor layer 51 is effected by, after a mask is formed on the conductor layer 51 by photolithography, removing portions of the conductor layer 51 by wet etching. Alternatively, the conductor layer 51 may be patterned by stamping the conductor layer 51 using a sharp die. According to the first example, it is not necessary to provide the coupling portions 13 required for the lead frame 10.

Figure 29:
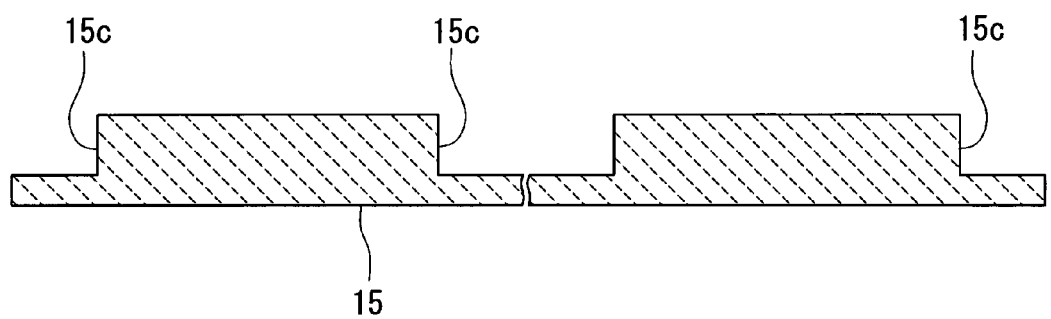
FIG. 29 is a cross-sectional view for illustrating another example of method of fabricating the wafer for electronic component packages of the first embodiment of the invention.
Figure 30:
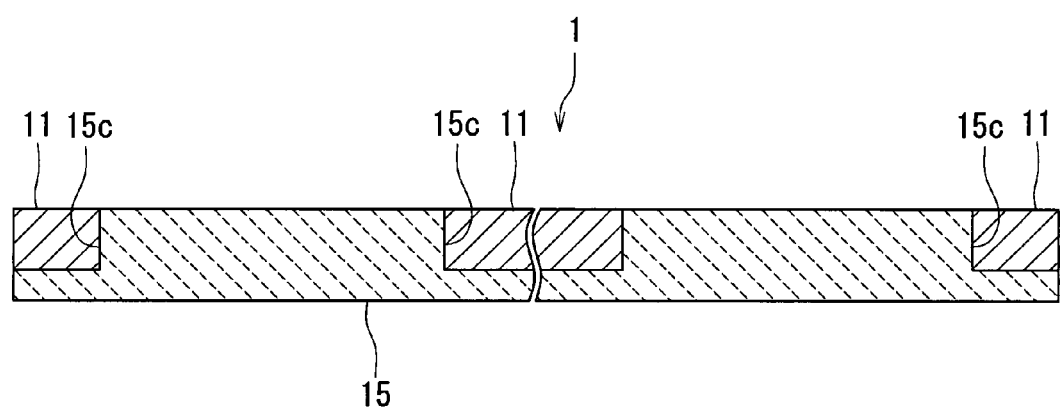
FIG. 30 is a cross-sectional view for illustrating the other example of method of fabricating the wafer for electronic component packages of the first embodiment of the invention.

Reference is now made to FIG. 29 and FIG. 30 to describe the second example of the method of fabricating the wafer 1 without using any lead frame. FIG. 29 and FIG. 30 are cross-sectional views for describing the second example. In the second example, first, the retainer 15 is formed such that the retainer 15 has grooves 15c for accommodating a plurality of sets of the external connecting terminals 11, as shown in FIG. 29. The grooves 15c can be formed by, for example, processing a plate made of a ceramic that will be the retainer 15.

In the following step of the second example, as shown in FIG. 30, the grooves 15c are filled with a conductive material that will be the plurality of sets of the external connecting terminals 11 to thereby form the plurality of sets of the external connecting terminals 11. A method of filling the grooves 15c with a conductive material can be melting a metal and pouring it into the grooves 15c, that is, casting. In this case, it is preferred to use a metal that melts at low temperatures.

Another example of the method of fabricating the wafer 1 without using any lead frame is to form the external connecting terminals 11 that are patterned on the plate-shaped retainer 15 by frame plating.

According to the method of manufacturing the electronic component package of the embodiment as thus described, the wafer 1 is first fabricated, the wafer 1 incorporating the plurality of sets of external connecting terminals 11 that correspond to a plurality of electronic component packages 40 and the retainer 15 for retaining the external connecting terminals 11, and including the plurality of pre-base portions 2 that will be the bases 41 of the electronic component packages 40 later by being separated from one another. Then, in the embodiment, at least one electronic component chip 3 is bonded to each of the pre-base portions 2 of the wafer 1, and the substructure 30 including the wafer 1 is cut so that the pre-base portions 2 are separated from one another and the plurality of bases 41 are thereby formed. The plurality of electronic component packages 40 are thus manufactured. As a result, according to the embodiment, it is possible to mass-produce the electronic component packages 40 at low costs in a short period of time.

The wafer 1 of the embodiment includes no circuit element. As a result, even if any alteration is required for the specifications of the electronic component packages 40, it is not totally required to make any alteration to the wafer 1, or even if a change in the number and/or arrangement of the external connecting terminals 11 is required, it is easy to make such a change. In addition, according to the embodiment, it is easy to alter the specifications of the electronic component packages 40 by modifying the chip 3 disposed in each of the pre-base portions 2 of the wafer 1. Because of these features of the embodiment, it is possible to flexibly and quickly respond to alterations to the specifications of the electronic component packages 40.

According to the embodiment, a plurality of chips 3 can be disposed in each of the pre-base portions 2 of the wafer 1, and these chips 3 can be connected to one another by the inter-chip connecting portions 22. It is thereby possible to mass-produce the electronic component packages 40 as multi-chip modules at low costs in a short period of time.

In the embodiment any combination of the plurality of chips 3 is possible in the case in which the plurality of chips 3 are disposed in each of the pre-base portions 2 and these chips 3 are connected to one another. Examples of combination of the plurality of chips 3 to be disposed in each of the pre-base portions 2 include a combination of two or more circuit elements of the same type or different types selected from C-MOS integrated circuit elements, high-speed C-MOS integrated circuit elements, high-withstand C-MOS integrated circuit elements, bipolar integrated circuit elements, high-speed bipolar integrated circuit elements, and high-withstand bipolar integrated circuit elements. Furthermore, a plurality of memory elements such as flash memory, SRAM, DRAM or PROM may be disposed as the plurality of chips 3 in each of the pre-base portions 2. It is thereby possible to manufacture the electronic component packages 40 each of which functions as a memory element having a large storage capacity. Furthermore, a sensor or an actuator formed by using the MEMS and a driver circuit element for driving it may be disposed in each of the pre-base portions 2.

In the embodiment, wiring may be formed by using bonding wire or a conductor layer formed on the retainer 15 of the wafer 1 in place of at least either the terminal connecting portions 21 or the inter-chip connecting portions 22 formed by plating. However, higher-density wiring is achievable by using the terminal connecting portions 21 and the inter-chip connecting portions 22 formed by plating, and it is therefore easier to downsize the electronic component packages 40, compared with the case in which wiring is formed by using bonding wire or a conductor layer formed on the retainer 15.

The terminal connecting portions 21 and the inter-chip connecting portions 22 may be formed by soldering instead of plating. In this case, for example, a thin metal plate made of stainless steal, for example, is punched to fabricate a mask having openings formed in regions where the terminal connecting portions 21 and the inter-chip connecting portions 22 are to be formed, the mask is placed on the insulating layer 16 having the openings 16a, and a molten solder is poured into the openings 16a and the openings of the mask. The terminal connecting portions 21 and the inter-chip connecting portions 22 are thereby formed. Through this method, it is easy to form the terminal connecting portions 21 and the inter-chip connecting portions 22.

In the embodiment, the connecting surface 11a of each of the external connecting terminals 11 is located higher than the chip bonding surface 12a. As a result, it is possible that the height of the top surface of each of the electrodes 3a of the chips 3 bonded to the chip bonding surface 12a is made close to the height of the connecting surface 11a. It is thereby possible to easily connect the chips 3 to the external connecting terminals 11 through the terminal connecting portions 21. In particular, in a case in which the difference in level between the connecting surface 11a and the chip bonding surface 12a is equal to or nearly equal to the thickness of the chips 3, it is possible to place the top surface of each of the electrodes 3a and the connecting surface 11a at the same height or nearly the same height, and it is thereby possible to easily form the terminal connecting portions 21 with precision.

Second Embodiment

Figure 31:
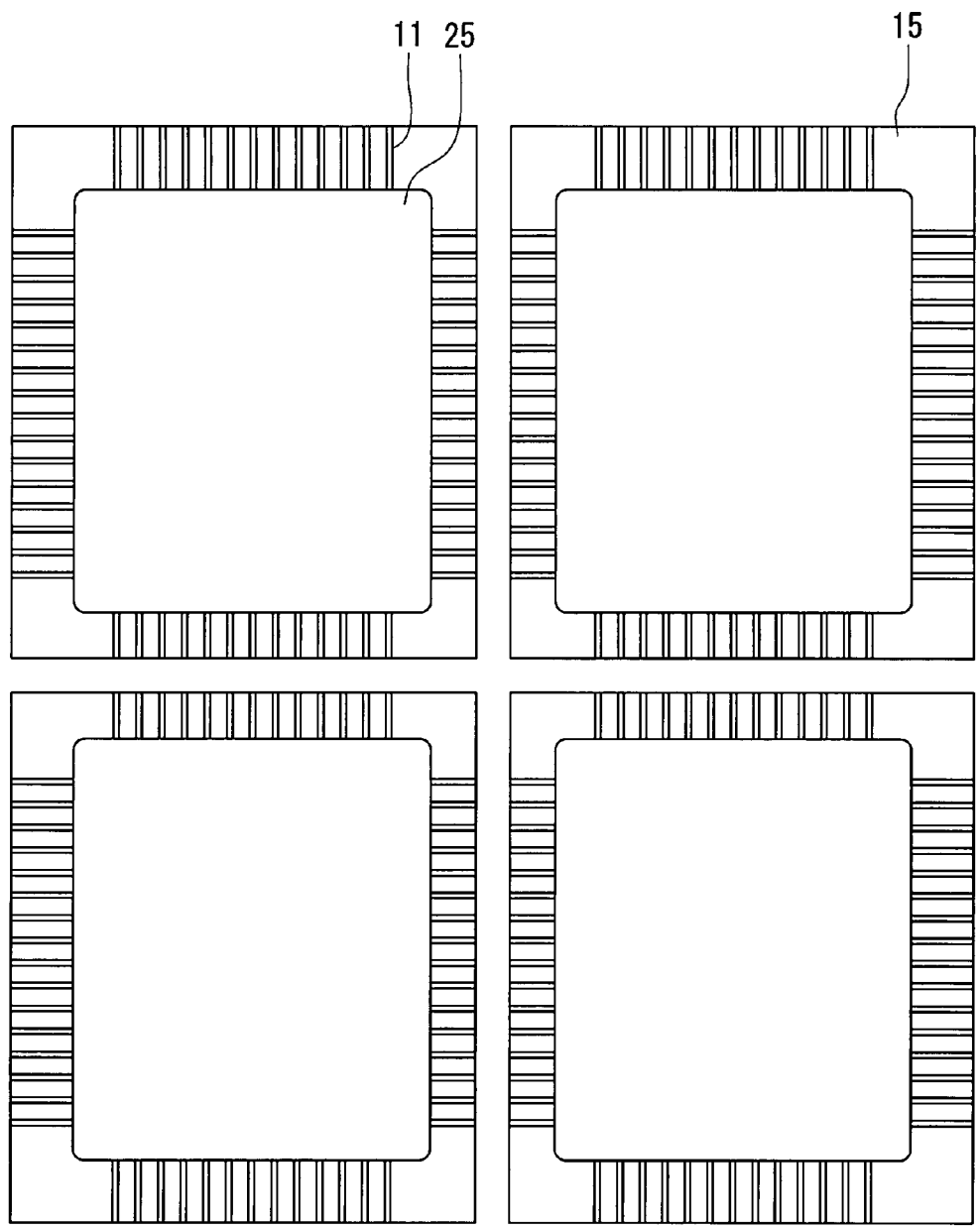
FIG. 31 is a top view illustrating a step of cutting a substructure of a second embodiment of the invention.
Figure 32:
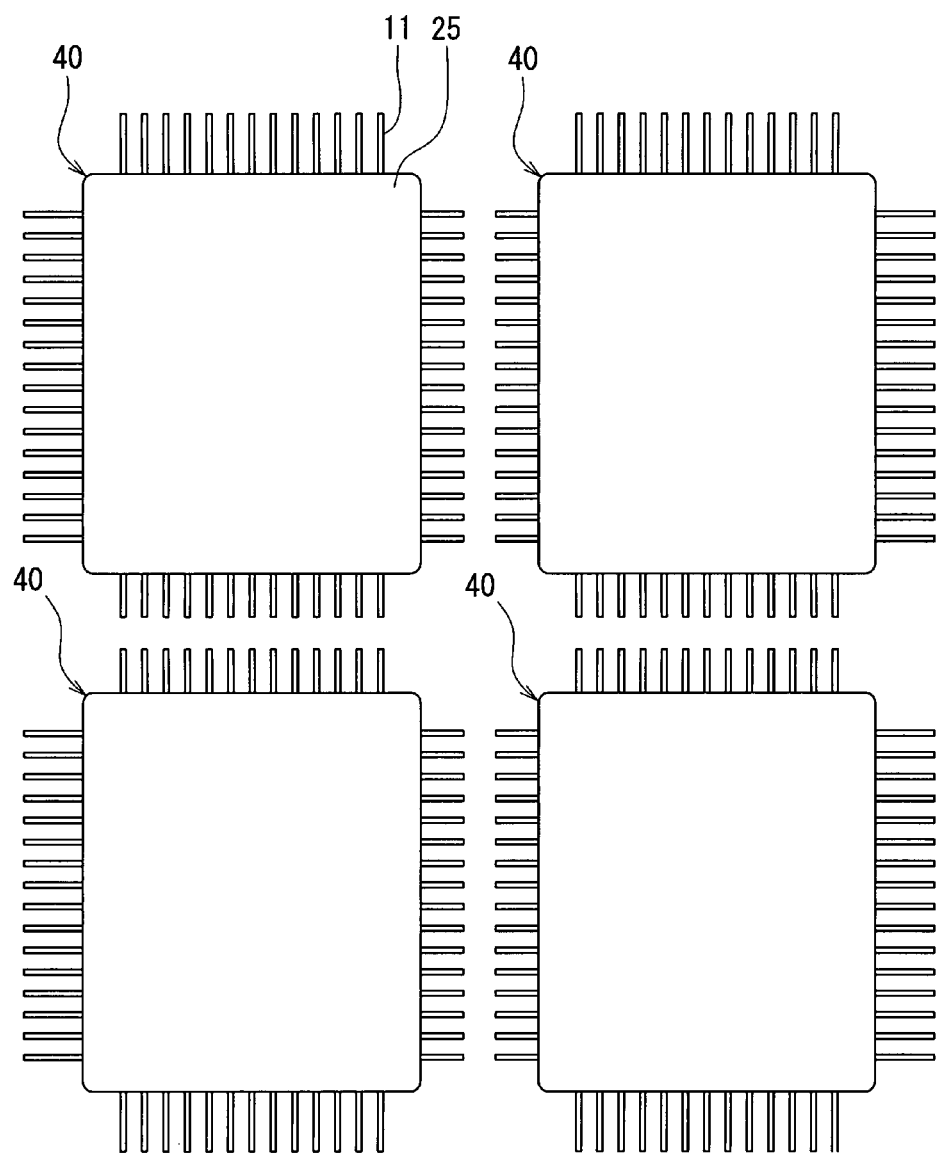
FIG. 32 is a top view of a layered structure obtained in a step that follows the step shown in FIG. 31.
Figure 33:
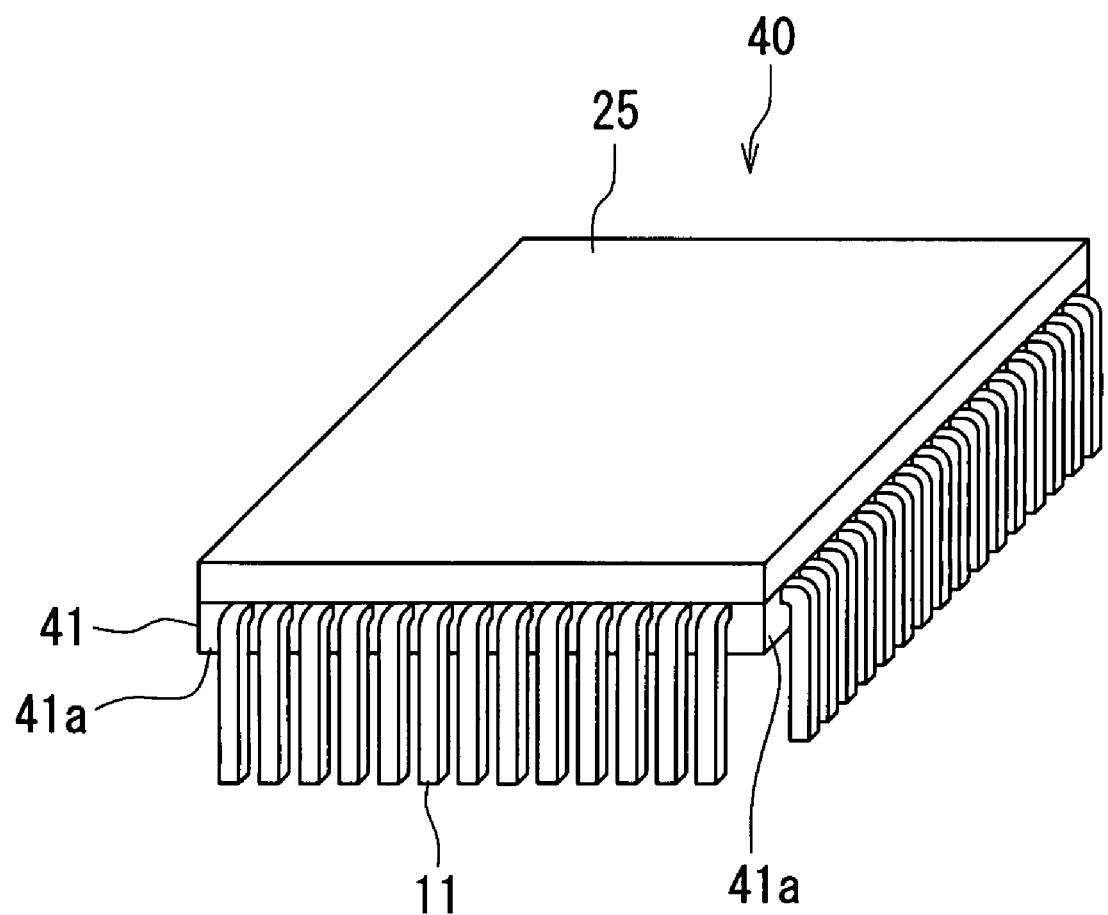
FIG. 33 is a perspective view illustrating an electronic component package of the second embodiment of the invention.

Reference will now be made to FIG. 31 to FIG. 33 to describe a second embodiment of the invention. A method of manufacturing an electronic component package of the second embodiment includes steps up to the step of forming the sealer 25, as shown in FIG. 15 and FIG. 16, which are the same as those of the first embodiment.

FIG. 31 is a top view illustrating the step of cutting the substructure 30 including the wafer 1 of the second embodiment. In FIG. 31 the insulating layer 16 is omitted. In the second embodiment, as shown in FIG. 31, the substructure 30 including the wafer 1 is cut such that portions of the external connecting terminals 11 located outside the perimeter of the sealer 25 are left unremoved.

In the following step of the second embodiment, as shown in FIG. 32, in each of a plurality of layered structures formed by cutting the substructure 30, portions of the retainer 15 and the insulating layer 16 located outside the perimeter of the sealer 25 are removed. As a result, the portions of the external connecting terminals 11 located outside the perimeter of the sealer 25 are exposed. The electronic component packages 40 of the second embodiment are thereby formed.

In the following step of the second embodiment, as shown in FIG. 33, the portions of the external connecting terminals 11 located outside the perimeter of the sealer 25 may be bent downward if required.

In the electronic component package 40 of the second embodiment, the side surface of the retainer 15 is the side surface 41a of the base 41. In the second embodiment the side surface 41a is formed such that a portion of each of the plurality of external connecting terminals 11 protrudes from the side surface 41a.

The remainder of configuration, function and effects of the second embodiment are similar to those of the first embodiment.

Third Embodiment

Figure 34:
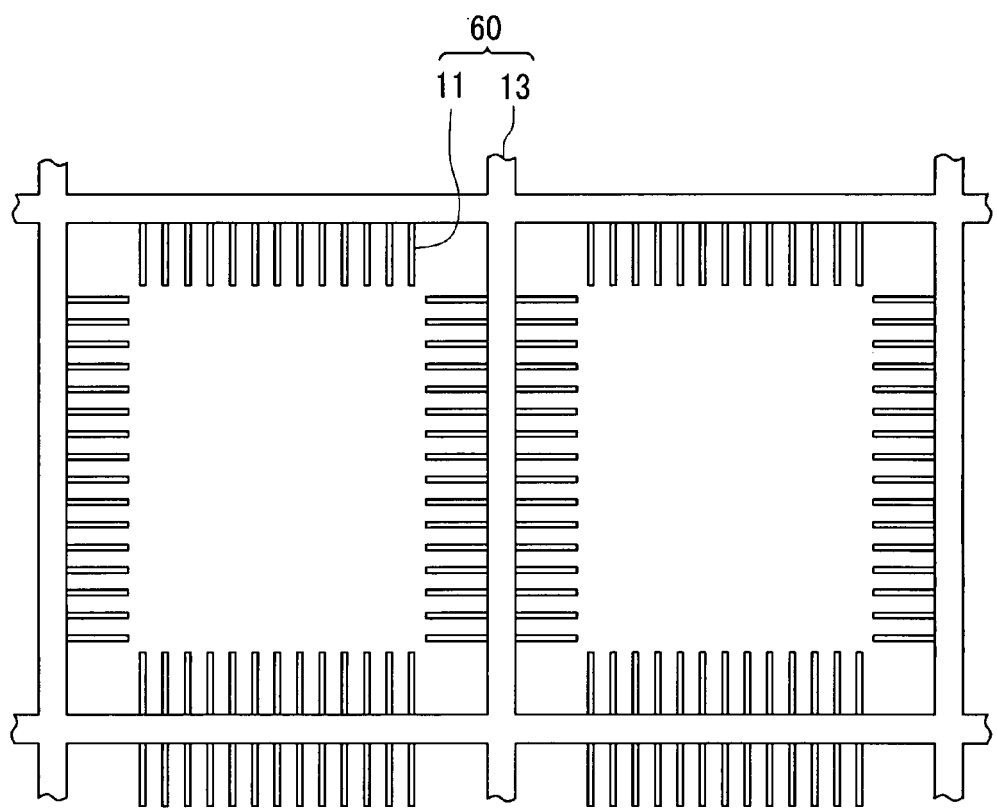
FIG. 34 is a top view of part of a lead frame used in a third embodiment of the invention.

A third embodiment of the invention will now be described. Reference is now made to FIG. 34 to FIG. 38 to describe the step of fabricating the wafer 1 of the third embodiment. In a method of manufacturing an electronic component package of the third embodiment, a lead frame 60 is first formed. FIG. 34 is a top view of part of the lead frame 60. The lead frame 60 includes: a plurality of sets of external connecting terminals 11 corresponding to a plurality of electronic component packages; and the coupling portion 13 for coupling the external connecting terminals 11 to one another. The lead frame 60 does not include the chip bonding conductor layer 12. A method of fabricating the lead frame 60 is the same as the method of fabricating the lead frame 10 of the first embodiment.

Figure 35:
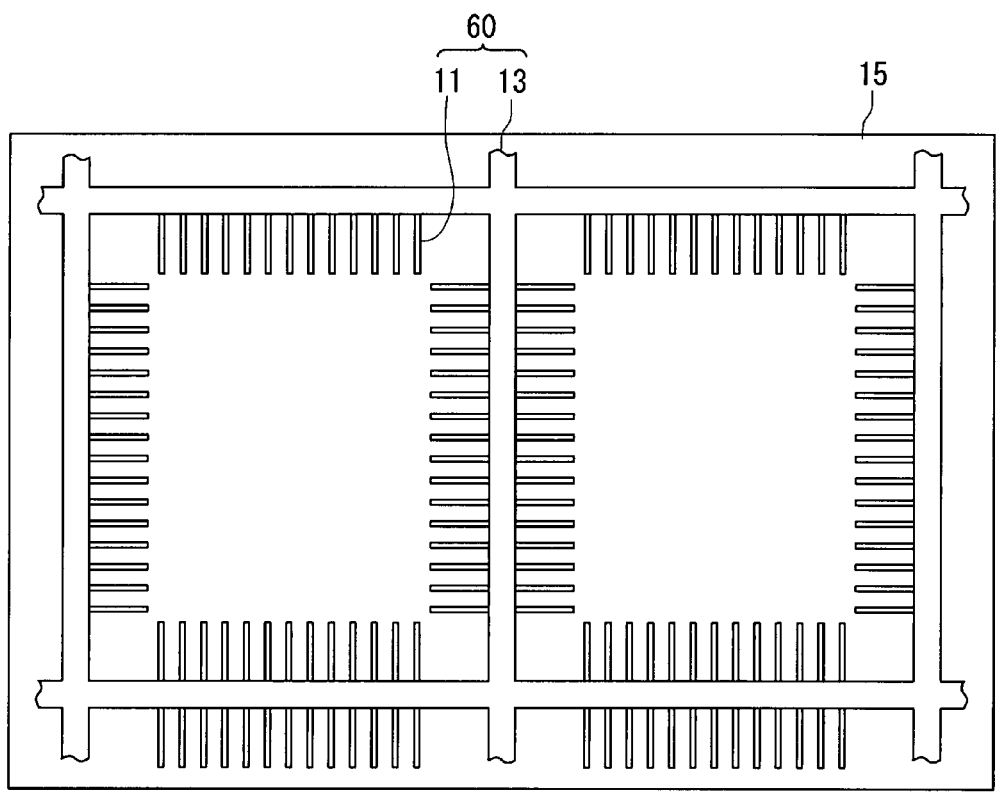
FIG. 35 is a top view of part of a layered structure fabricated in the manufacturing process of an electronic component package of the third embodiment of the invention.
Figure 36:
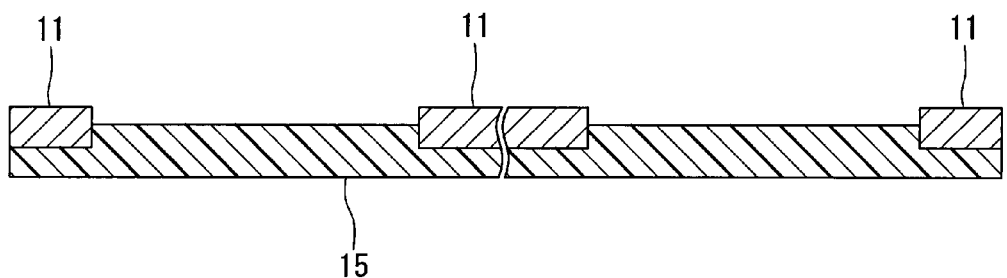
FIG. 36 is a cross-sectional view of part of the layered structure of FIG. 35.

FIG. 35 and FIG. 36 illustrate the following step. FIG. 35 is a top view of part of a layered structure fabricated in the manufacturing process of the electronic component package. FIG. 36 is a cross-sectional view of part of the layered structure. In the step, the lead frame 60 and the retainer 15 are integrated with each other. A method of integrating the lead frame 60 and the retainer 15 with each other is the same as that of the first embodiment. In the third embodiment, as shown in FIG. 36, a difference in level is created between the top surface of each of the external connecting terminals 11 and portions of the top surface of the retainer 15 surrounded by the plurality of external connecting terminals 11, such that the top surface of each of the external connecting terminals 11 is located higher. The difference in level may be formed by polishing or dry etching in the same manner as the method described with reference to FIG. 22 and FIG. 23 in the first embodiment.

Figure 37:
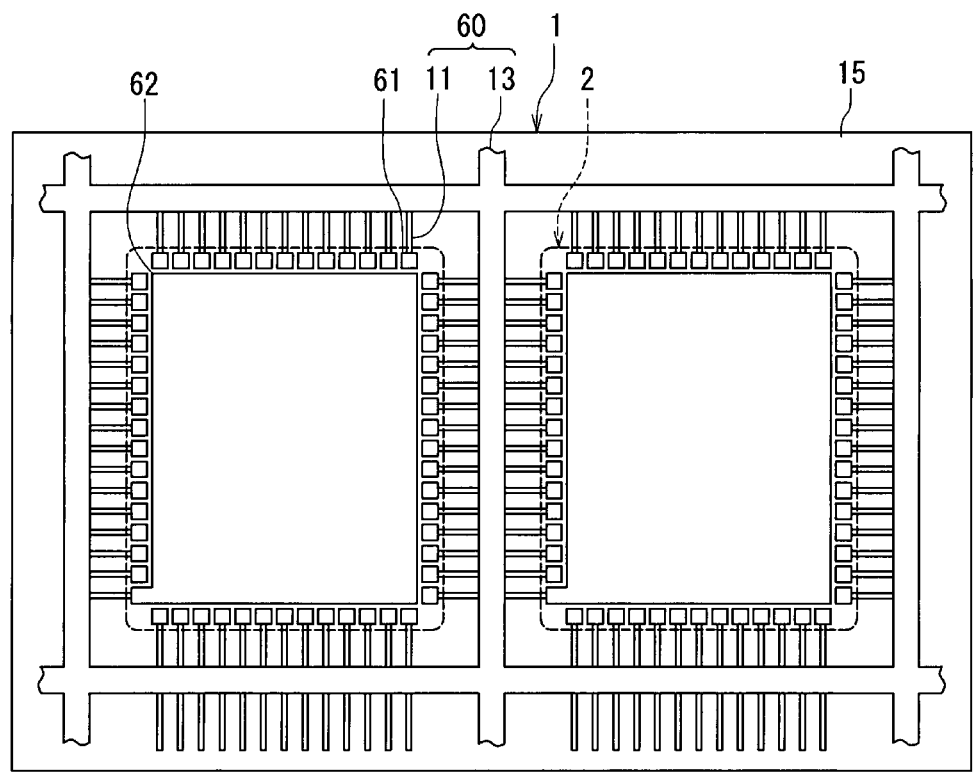
FIG. 37 is a top view of part of a wafer for electronic component packages of the third embodiment of the invention.
Figure 38:
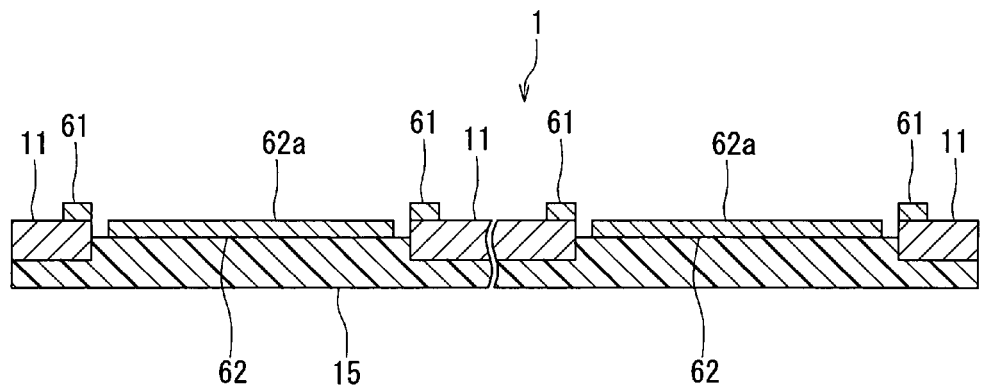
FIG. 38 is a cross-sectional view of part of the wafer for electronic component packages of FIG. 37.

FIG. 37 and FIG. 38 illustrate the following step. FIG. 37 is a top view of part of the wafer 1. FIG. 38 is a cross-sectional view of part of the wafer 1. In the step, plating is performed, for example, to form a terminal conductor layer 61 on a potion of the top surface of each of the external connecting terminals 11, the portion being near an end closer to the center of the pre-base portions 2, and to form a chip bonding conductor layer 62 on each of portions of the top surface of the retainer 15 surrounded by the plurality of external connecting terminals 11. The top surface of the chip bonding conductor layer 62 is a chip bonding surface 62a. The wafer 1 of the third embodiment is thus fabricated.

The wafer 1 of the third embodiment incorporates a plurality of sets of terminal conductor layers 61 connected to the plurality of sets of external connecting terminals 11. At least one chip 3 is to be electrically connected to the terminal conductor layers 61. In the third embodiment, a difference in level is formed between the top surface of each of the terminal conductor layers 61 and the chip bonding surface 62a such that the top surface of each of the terminal conductor layers 61 is located higher. It is preferred that this difference in level be equal to or nearly equal to the thickness of the chip 3.

Figure 39:
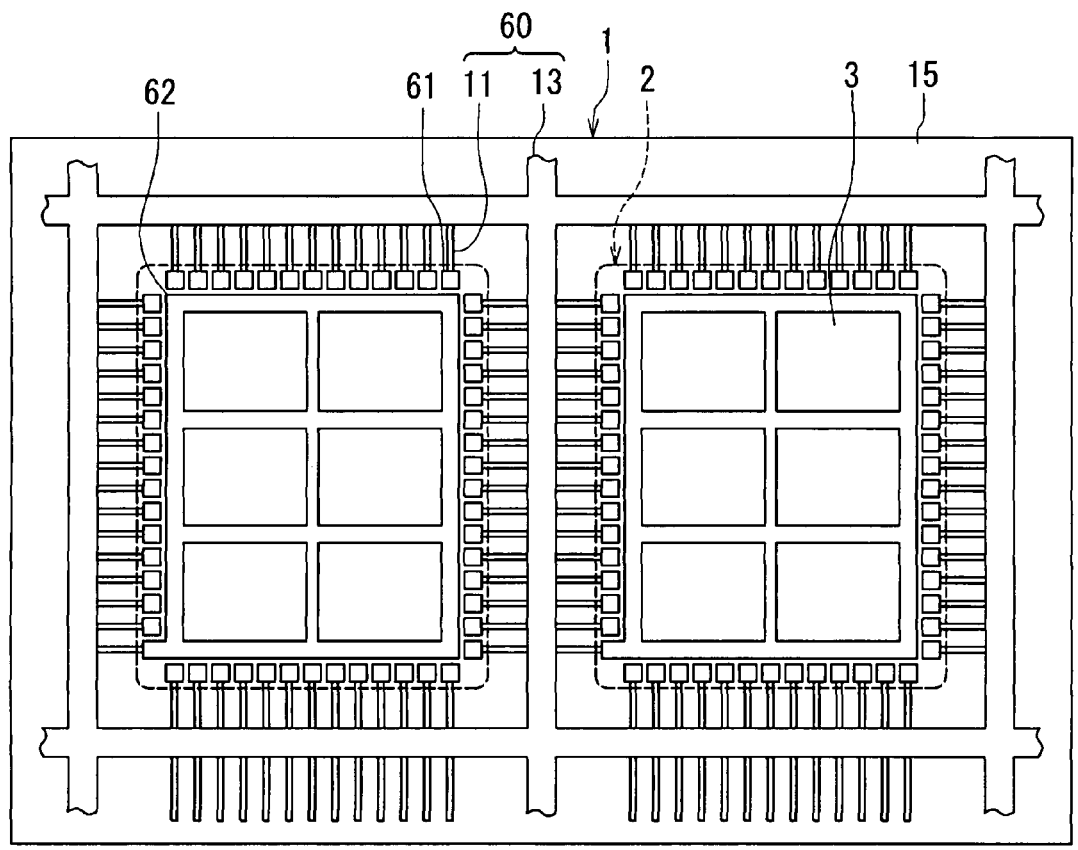
FIG. 39 is a top view of part of the layered structure obtained in the manufacturing process of the electronic component package of the third embodiment of the invention.
Figure 40:
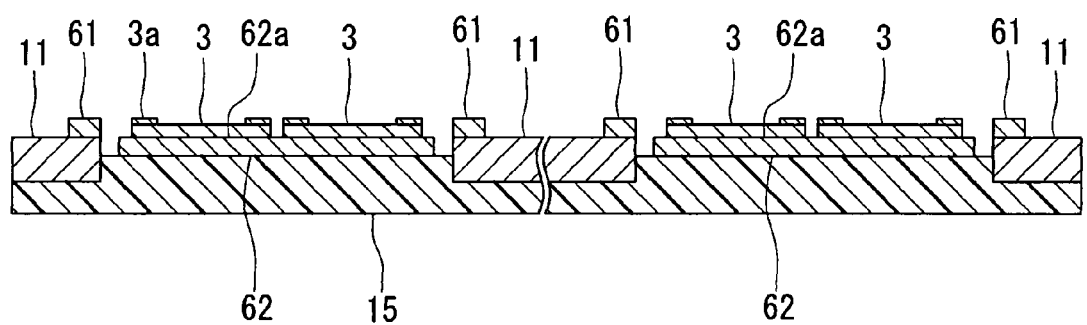
FIG. 40 is a cross-sectional view of part of the layered structure of FIG. 39.

FIG. 39 and FIG. 40 illustrate the following step. FIG. 39 is a top view of part of the layered structure. FIG. 40 is a cross-sectional view of part of the layered structure. In the step, at least one chip 3 is bonded to the chip bonding surface 62a of each of the pre-base portions 2 of the wafer 1. FIG. 39 and FIG. 40 illustrate an example in which six chips 3 are bonded to one chip bonding surface 62a. Each of the chips 3 has a top surface, a bottom surface and a plurality of electrodes 3a disposed on the top surface. Each of the chips 3 is placed such that the bottom surface thereof is bonded to the chip bonding surface 62a. The top surfaces of the electrodes 3a are located at the same height or nearly the same height as the top surfaces of the terminal conductor layers 61.

The terminal conductor layers 61 and the chip bonding conductor layers 62 may be formed by soldering. In this case, when the chips 3 are bonded to the chip bonding conductor layers 62, the temperature of the conductor layers 62 made of solder is raised to melt the conductor layers 62, so that it is possible to easily bond the chips 3 to the chip bonding conductor layers 62 without using any additional solder or flux.

The following steps of the method of manufacturing the electronic component package of the third embodiment are similar to the steps of the first or second embodiment performed after the chips 3 are bonded.

In the third embodiment it is possible to precisely form through plating the terminal conductor layers 61 connected to the external connecting terminals 11 and electrically connected to the electrodes 3a of the chips 3 through the terminal connecting portions 21. As a result, according to the third embodiment, it is possible to align the terminal conductor layers 61 and the electrodes 3a with respect to each other with higher precision, compared with the case in which the external connecting terminals 11 formed through the use of a lead frame and the electrodes 3a are aligned with respect to each other. It is thereby possible to electrically connect the external connecting terminals 11 and the chips 3 to each other with precision.

The remainder of configuration, function and effects of the third embodiment are similar to those of the first or second embodiment.

Fourth Embodiment

Figure 41:
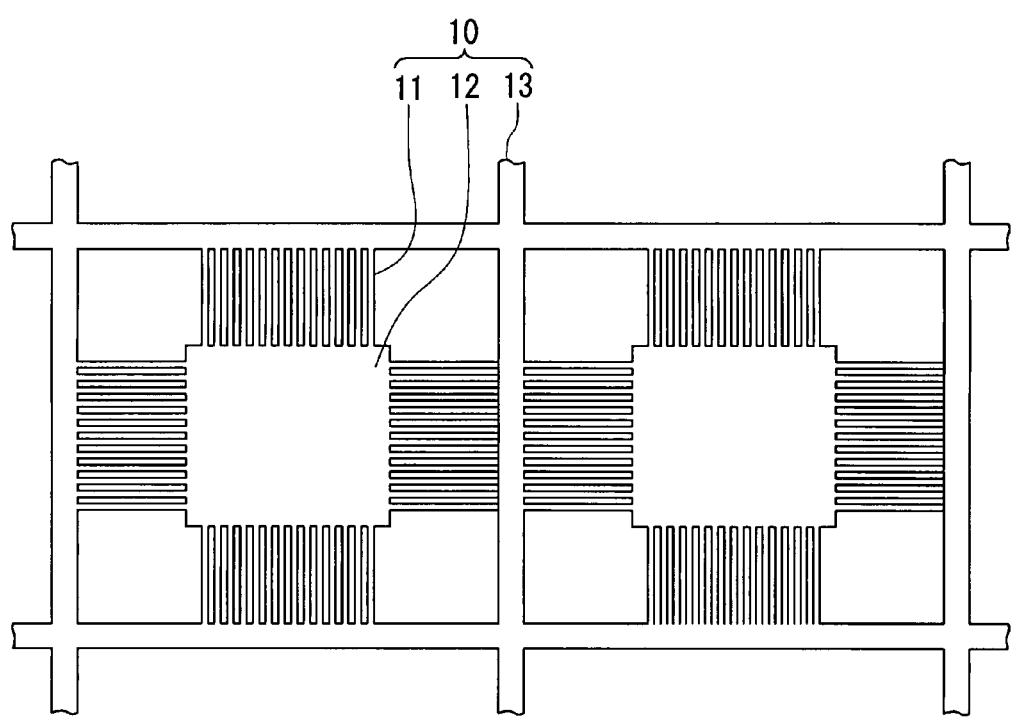
FIG. 41 is a top view of part of a lead frame used in a fourth embodiment of the invention.

A fourth embodiment of the invention will now be described. Reference is now made to FIG. 41 to FIG. 47 to describe the step of fabricating the wafer 1 of the fourth embodiment. In the step of fabricating the wafer 1, the lead frame 10 is first formed. FIG. 41 is a top view of part of the lead frame 10. The lead frame 10 includes: a plurality of sets of external connecting terminals 11 corresponding to a plurality of electronic component packages; a plurality of chip bonding conductor layers 12 corresponding to the plurality of electronic component packages; and the coupling portion 13 for coupling the external connecting terminals 11 and the chip bonding conductor layers 12. In the lead frame 10 of the fourth embodiment, each of the external connecting terminals 11 has an end connected to the coupling portion 13, and the other end connected to the chip bonding conductor layers 12. A method of fabricating the lead frame 10 is the same as that of the first embodiment.

Figure 42:
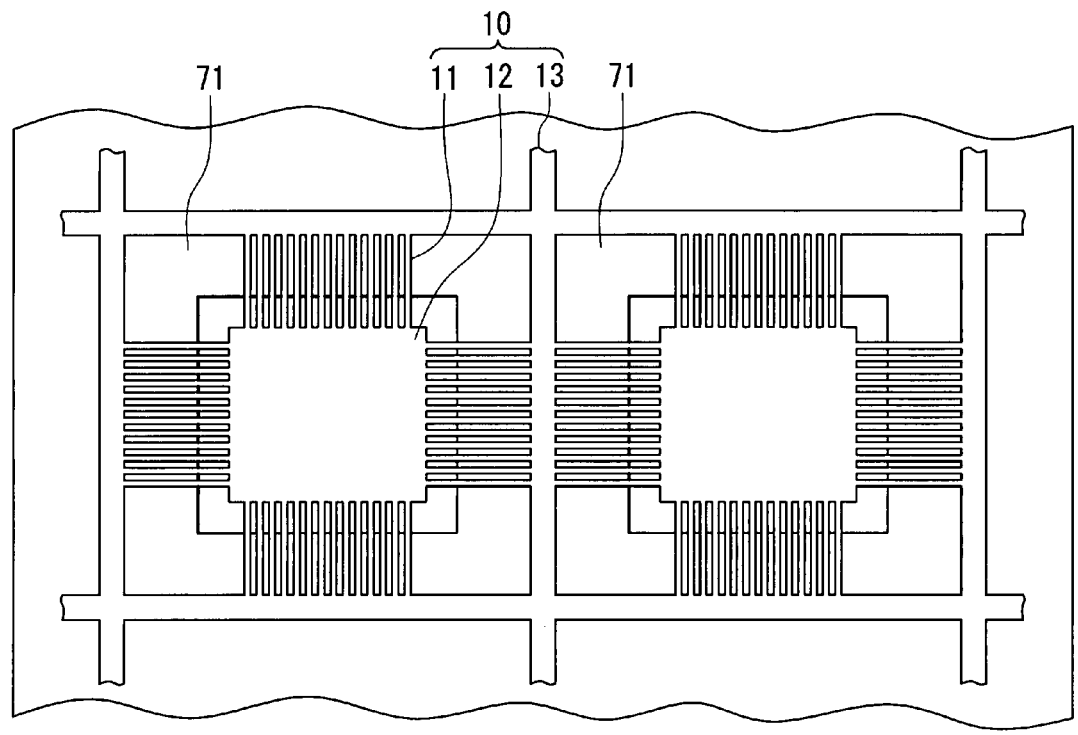
FIG. 42 is a top view of part of a layered structure fabricated in the manufacturing process of an electronic component package of the fourth embodiment of the invention.
Figure 43:
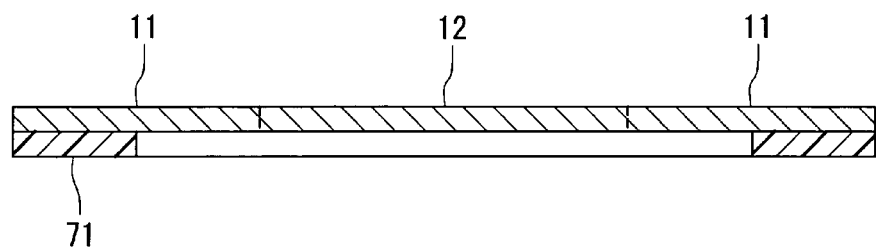
FIG. 43 is a cross-sectional view of part of the layered structure of FIG. 42.

FIG. 42 and FIG. 43 illustrate the following step. FIG. 42 is a top view of part of a layered structure fabricated in the manufacturing process of the electronic component package. FIG. 43 is a cross-sectional view of part of the layered structure. In the step, portions to be removed 71 are formed to retain portions of the lead frame 10 located around the pre-base portions. The portions to be removed 71 will be part of the retainer later. The portions to be removed 71 are made of a resin, for example.

Figure 44:
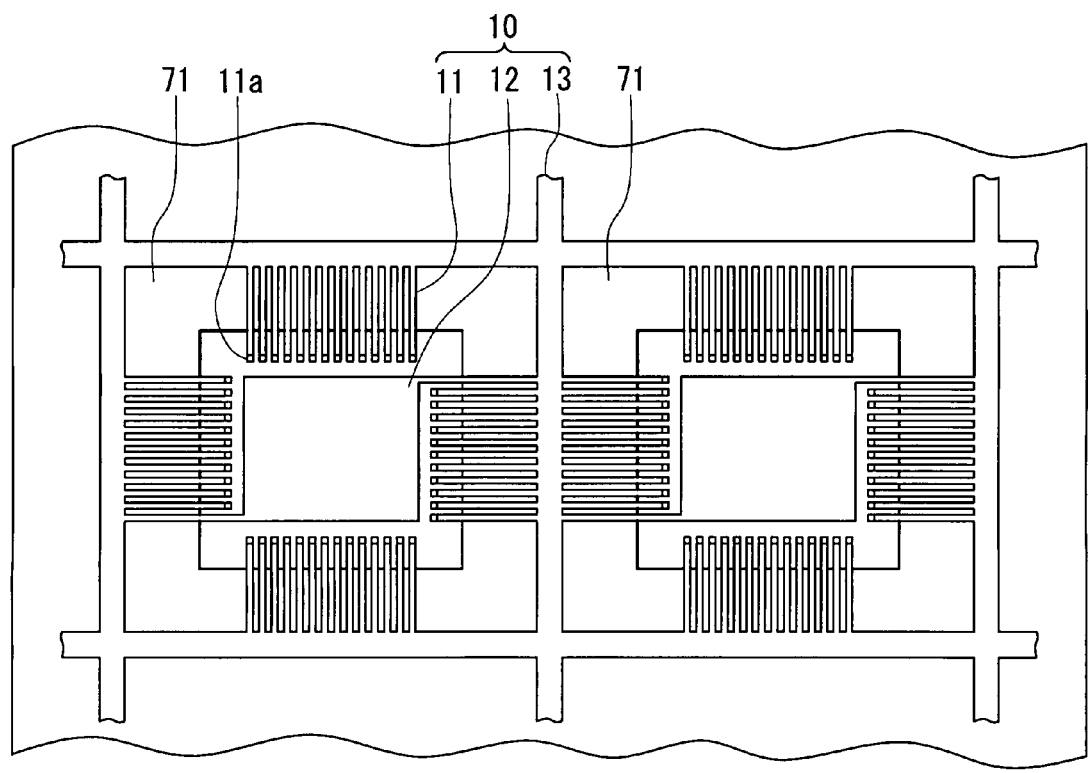
FIG. 44 is a top view of part of the layered structure obtained in a step that follows the step shown in FIG. 42.
Figure 45:
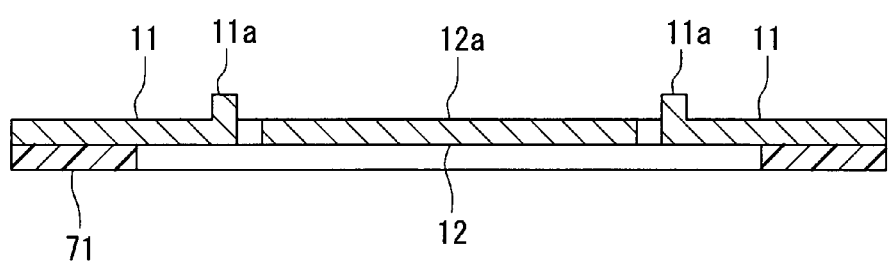
FIG. 45 is a cross-sectional view of part of the layered structure of FIG. 44.

FIG. 44 and FIG. 45 illustrate the following step. FIG. 44 is a top view of part of the layered structure. FIG. 45 is a cross-sectional view of part of the layered structure. In the step, the plurality of external connecting terminals 11 except some of the external connecting terminals 11 and the chip bonding conductor layers 12 are separated from each other through the use of a die, for example, and a portion of each of the external connecting terminals 11 near an end thereof thus formed is bent upward. The top surface of this portion bent upward is the connecting surface 11a. The top surfaces of the chip bonding conductor layers 12 are the chip bonding surfaces 12a.

Figure 46:
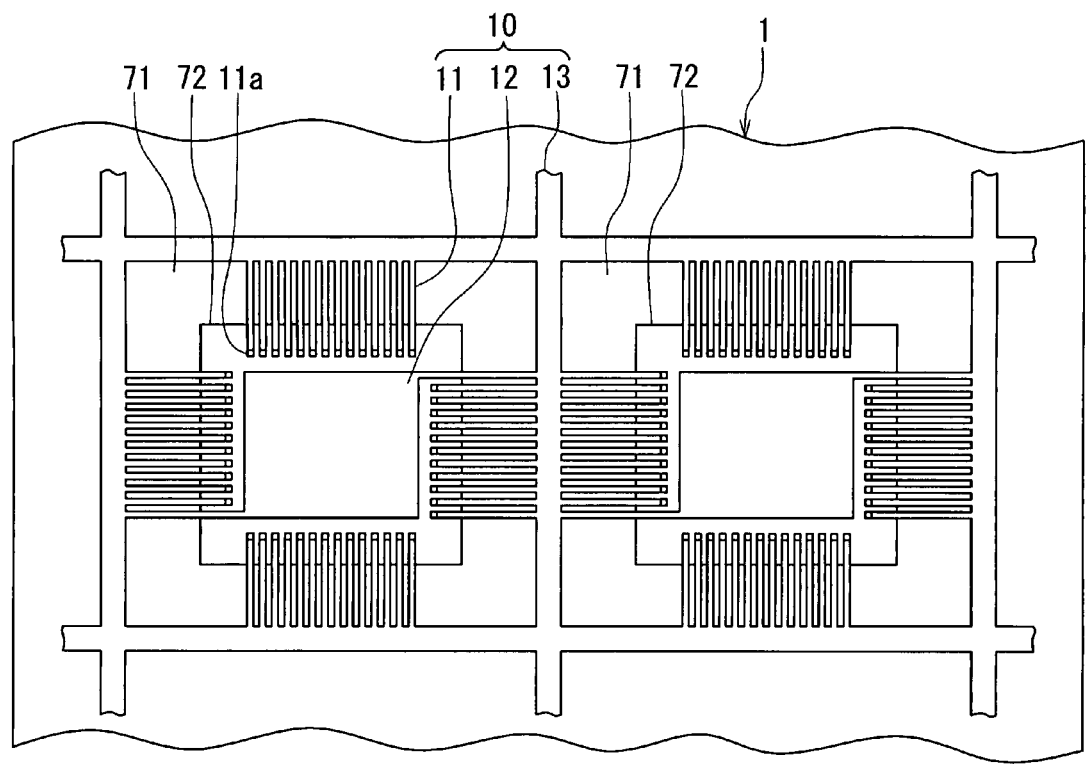
FIG. 46 is a top view of the layered structure obtained in a step that follows the step shown in FIG. 44.
Figure 47:
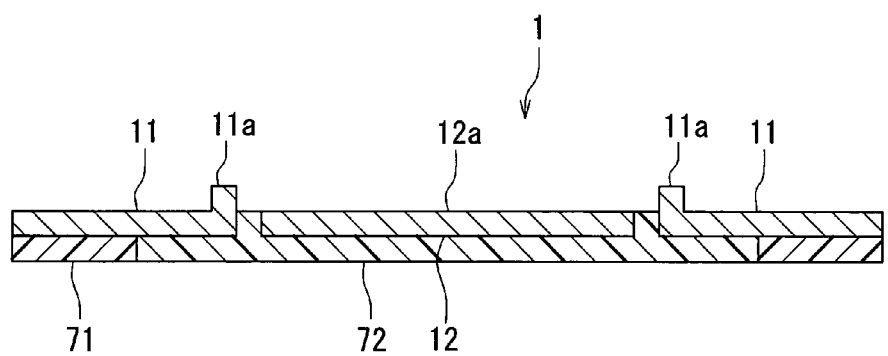
FIG. 47 is a cross-sectional view of part of the layered structure of FIG. 46.

FIG. 46 and FIG. 47 illustrate the following step. FIG. 46 is a top view of part of the layered structure. FIG. 47 is a cross-sectional view of part of the layered structure. In the step, base forming portions 72 are formed to retain portions of the lead frame 10 located in the pre-base portions. The base forming portions 72 are made of a resin, for example. The retainer is formed of the base forming portions 72 and the portions to be removed 71. The wafer 1 of the fourth embodiment is thus formed. In the wafer 1 each of the external connecting terminals 11 extends across the base forming portion 72 and the portion to be removed 71. There is a difference in level formed between the connecting surface 11a and the chip bonding surface 12a such that the connecting surface 11a is located higher. It is preferred that this difference in level be equal to or nearly equal to the thickness of the chip 3.

The portions to be removed 71 and the base forming portions 72 are made of different materials. It is preferred that the material of the portions to be removed 71 be softer than the material of the base forming portions 72 when compared on the scale of the Rockwell hardness or the Shore hardness, for example.

Figure 48:
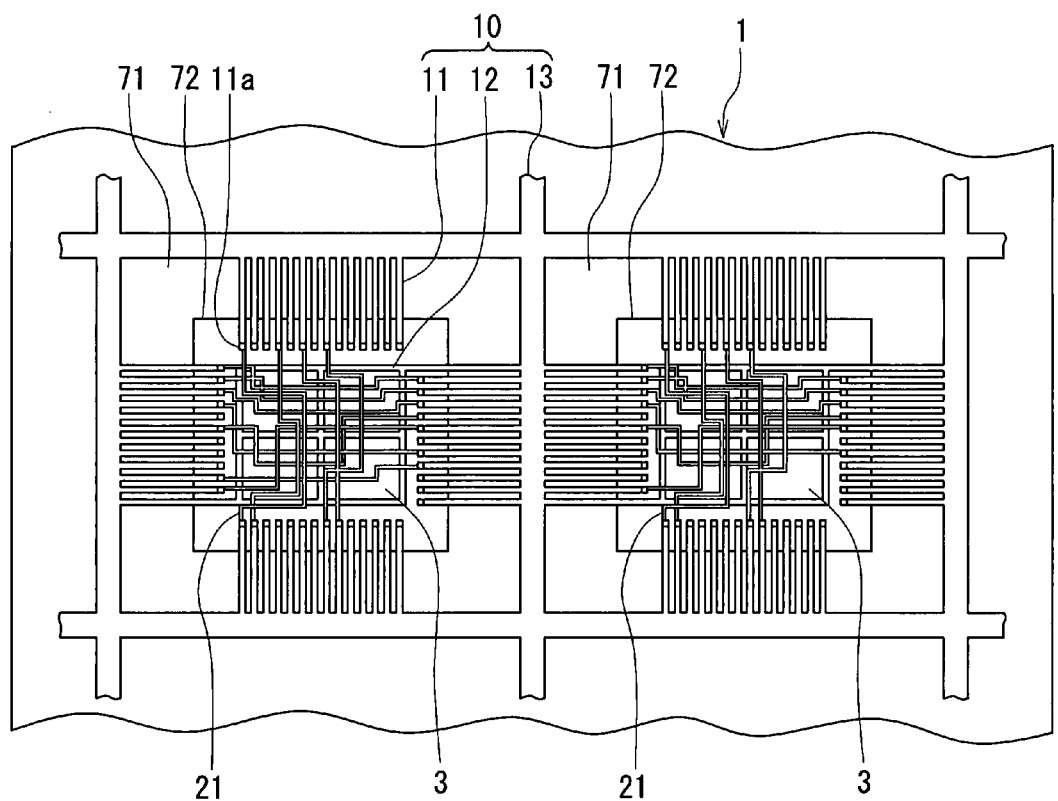
FIG. 48 is a top view of the layered structure obtained in a step that follows the step shown in FIG. 46.
Figure 49:
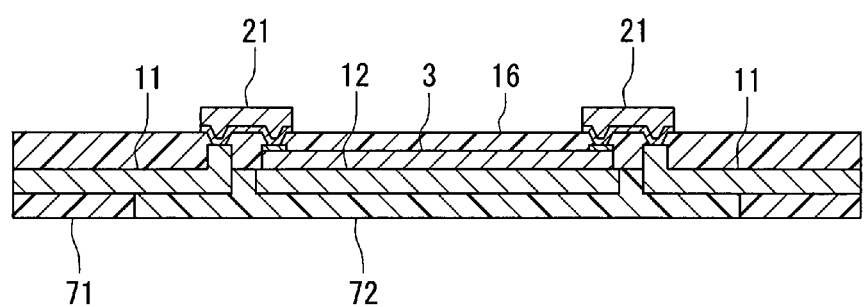
FIG. 49 is a cross-sectional view of part of the layered structure of FIG. 48.
Figure 50:
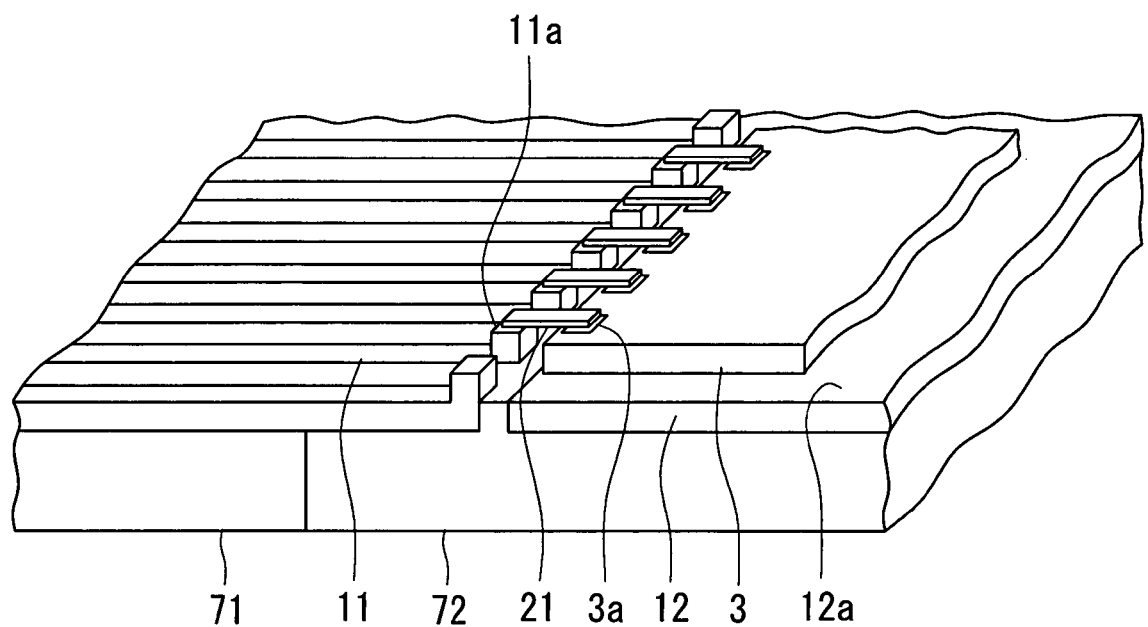
FIG. 50 is a perspective view illustrating terminal connecting portions and a neighborhood thereof of the fourth embodiment of the invention.

FIG. 48 to FIG. 50 illustrate the following step. FIG. 48 is a top view of part of the layered structure. FIG. 49 is a cross-sectional view of part of the layered structure. FIG. 50 is a perspective view illustrating the terminal connecting portions 21 and a neighborhood thereof. In the step, first, at least one chip 3 is bonded to the chip bonding surface 12a of each of the pre-base portions of the wafer 1. Although FIG. 48 and FIG. 49 illustrate an example in which one chips 3 is bonded to one chip bonding surface 12a, a plurality of chips 3 may be bonded to one chip bonding surface 12a. The chip 3 has a top surface, a bottom surface and a plurality of electrodes 3a disposed on the top surface. The chip 3 is placed such that the bottom surface thereof is bonded to the chip bonding surface 12a. The top surfaces of the electrodes 3a are located at the same height or nearly the same height as the connecting surfaces 11a. Next, the terminal connecting portions 21 are formed. A method of forming the terminal connecting portions 21 is the same as that of the first embodiment. In the case in which a plurality of chips 3 are bonded to one chip bonding surface 12a, inter-chip connecting portions may be formed at the same time as the terminal connecting portions 21 are formed.

Figure 51:
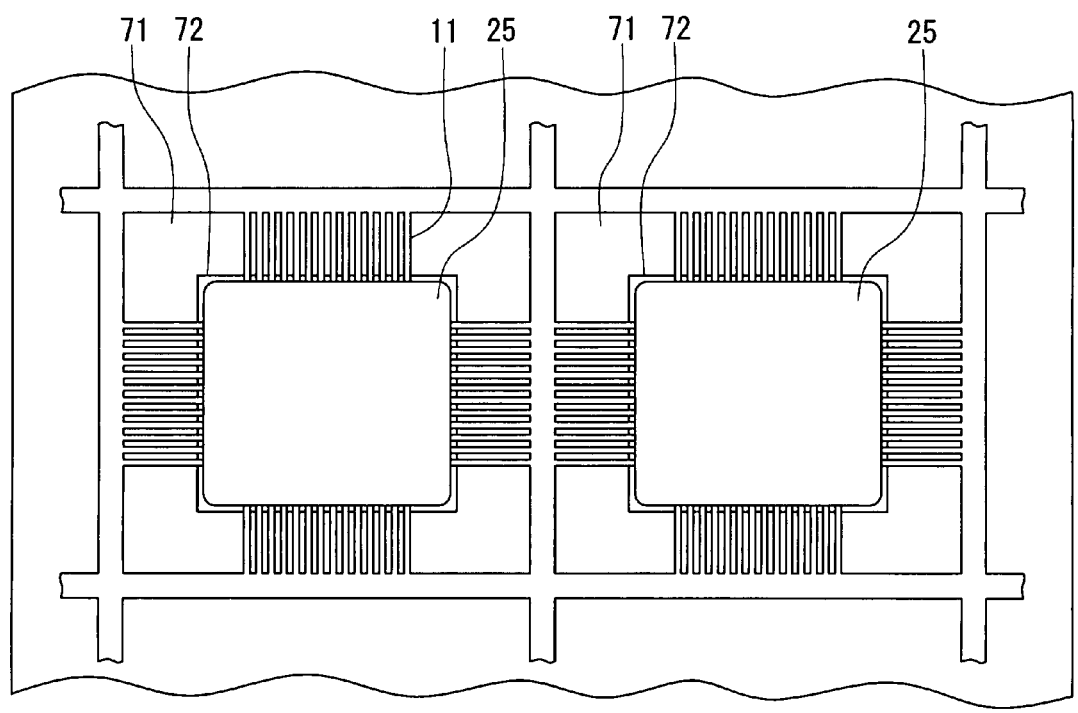
FIG. 51 is a top view of the layered structure obtained in a step that follows the step shown in FIG. 48.
Figure 52:
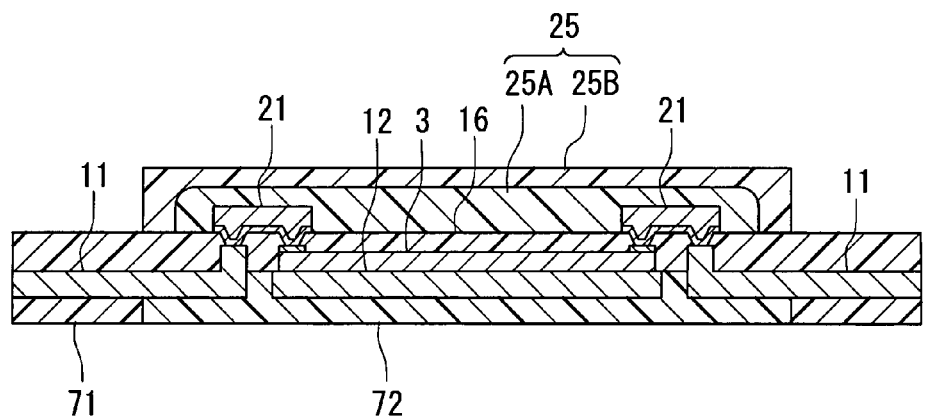
FIG. 52 is a cross-sectional view of part of the layered structure of FIG. 51.

FIG. 51 and FIG. 52 illustrate the following step. FIG. 51 is a top view of part of the layered structure. FIG. 52 is a cross-sectional view of part of the layered structure. In FIG. 51 the insulating layer 16 is omitted. In the step, the sealers 25 are formed. A method of forming the sealers 25 is the same as that of the first embodiment. In the fourth embodiment, the sealers 25 are formed such that the perimeter of each of the sealers 25 is located at a position corresponding to the boundary between the portion to be removed 71 and the base forming portion 72. The substructure of the fourth embodiment is thus formed.

Figure 53:
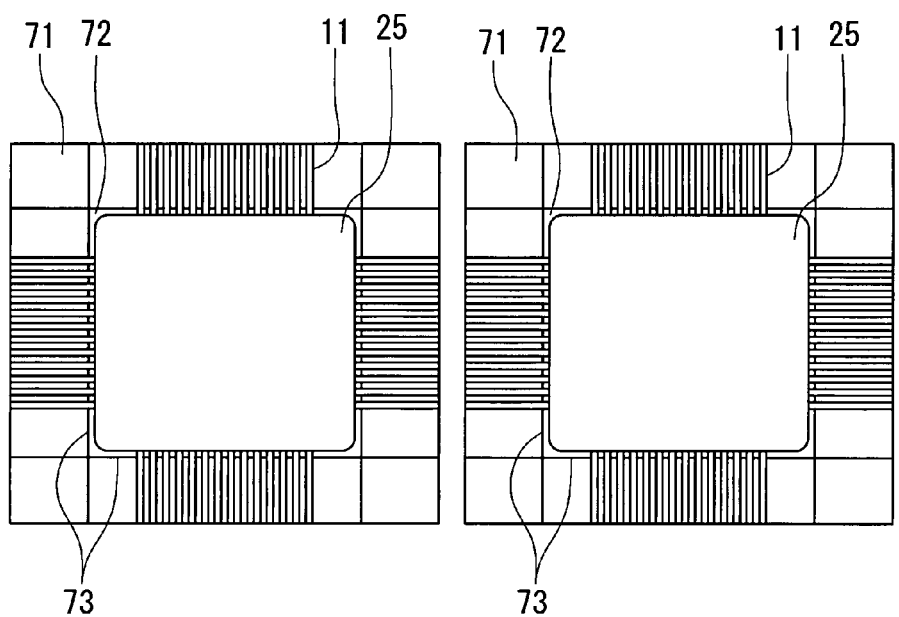
FIG. 53 is a top view of the layered structure obtained in a step that follows the step shown in FIG. 51.
Figure 54:
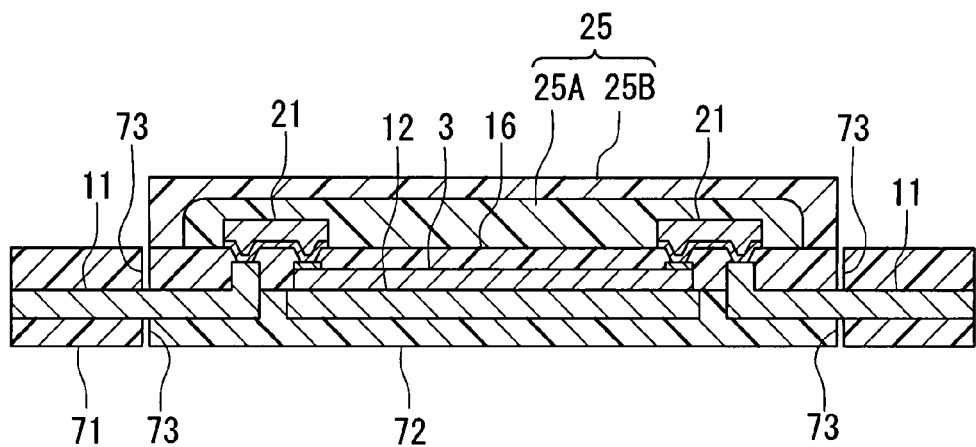
FIG. 54 is a cross-sectional view of part of the layered structure of FIG. 53.

FIG. 53 and FIG. 54 illustrate the following step. FIG. 53 is a top view of part of the layered structure. FIG. 54 is a cross-sectional view of part of the layered structure. In FIG. 53 the insulating layer 16 is omitted. In the step, first, grooves 73 are respectively formed at the boundary between the portion to be removed 71 and the base forming portion 72 of the retainer, and at the position in the insulating layer 16 corresponding to the perimeter of the sealer 25. Since the portion to be removed 71 and the base forming portion 72 are made of different materials, it is easy to form the groove 73 at the boundary between the portion to be removed 71 and the base forming portion 72. In particular, in the case in which the portion to be removed 71 is made of a material softer than the material of the base forming portion 72, it is easier to form the groove 73 at the boundary between the portion to be removed 71 and the base forming portion 72 of the retainer. Next, as shown in FIG. 53, the substructure including the wafer 1 is cut at the positions of the coupling portion 13 of the lead frame 10.

Figure 55:
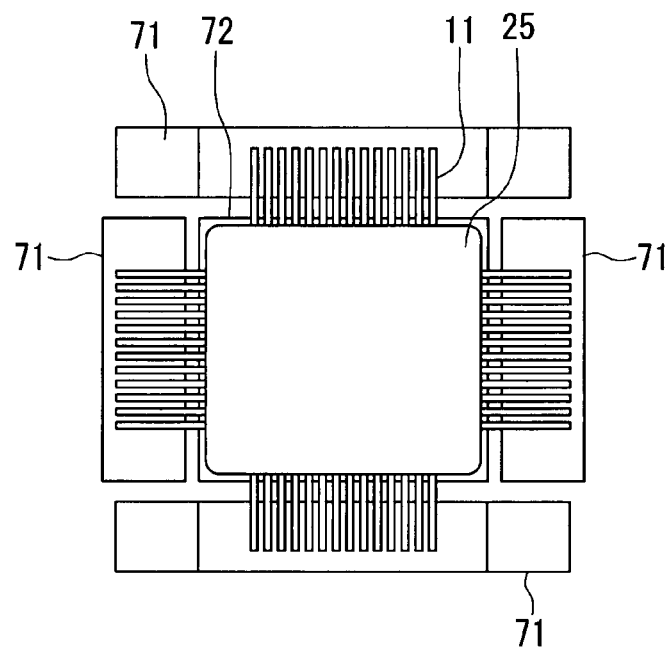
FIG. 55 is a top view of the layered structure obtained in a step that follows the step shown in FIG. 53.
Figure 56:
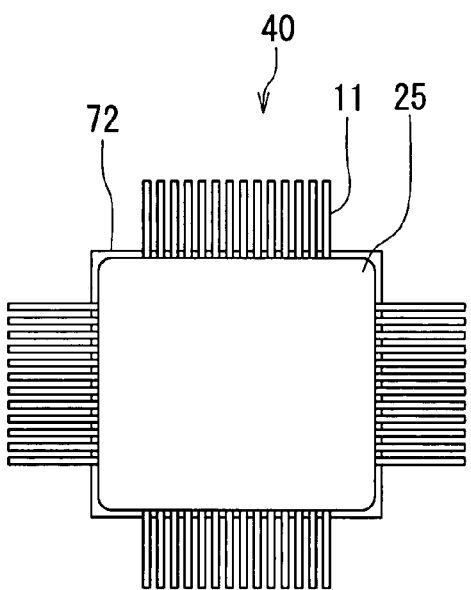
FIG. 56 is a top view of the electronic component package of the fourth embodiment of the invention.
Figure 57:
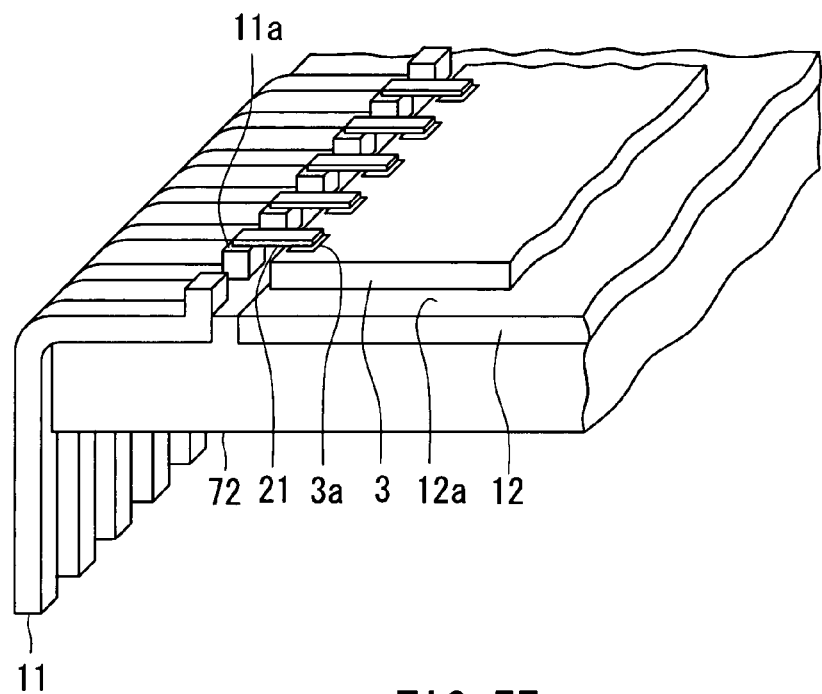
FIG. 57 is a perspective view illustrating external connecting terminals and a neighborhood thereof of the fourth embodiment of the invention.

FIG. 55 to FIG. 57 illustrate the following step. FIG. 55 is a top view of a layered structure obtained by cutting the substructure 30. FIG. 56 is a top view of the electronic component package 40. FIG. 56 is a perspective view illustrating the terminal connecting terminals 11 of the electronic component package 40 and a neighborhood thereof. In FIG. 55 the insulating layer 16 is omitted. In the step, as shown in FIG. 55, the portions to be removed 71 and portions of the insulating layer 16 located outside the grooves 73 are removed from the layered structure obtained by cutting the substructure 30. As previously described, since the grooves 73 are formed in the retainer and the insulating layer 16, it is easy to remove the portions to be removed 71 and the portions of the insulating layer 16 located outside the grooves 73. The electronic component package 40 is thus formed. In the electronic component package 40 of the fourth embodiment, the side surface of the base forming portion 72 is the side surface of the base. In the fourth embodiment the side surface of the base is formed such that a portion of each of the plurality of external connecting terminals 11 protrudes from the side surface of the base.

In the fourth embodiment, as shown in FIG. 57, the portions of the external connecting terminals 11 located outside the side surface of the base forming portion 72 may be bent downward in the following step as required.

According to the fourth embodiment, it is easy to manufacture the electronic component package 40 having such a structure that a portion of each of the plurality of external connecting terminals 11 protrudes from the side surface of the base.

The remainder of configuration, function and effects of the fourth embodiment are similar to those of the first embodiment.

The present invention is not limited to the foregoing embodiments but may be practiced in still other ways. For example, the terminal connecting portions 21 may be those for connecting the plurality of electrodes 3a of the chip 3 to at least one external connecting terminal 11, or may be those for connecting at least one electrode 3a of the chip 3 to the plurality of external connecting terminals 11. The inter-chip connecting portions 22 may be those for connecting three or more electrodes 3a of the plurality of chips 3 to one another.

Obviously many modifications and variations of the present invention are possible in the light of the above teachings. It is therefore to be understood that within the scope of the appended claims the invention may be practiced otherwise than as specifically described.

What is claimed is:

1. A method of manufacturing an electronic component package, the electronic component package comprising: a base incorporating a plurality of external connecting terminals; and at least one electronic component chip that is bonded to the base and electrically connected to at least one of the external connecting terminals, the method comprising the steps of:

fabricating a wafer incorporating a plurality of sets of external connecting terminals corresponding to a plurality of electronic component packages, and a retainer for retaining the plurality of sets of external connecting terminals, the wafer including a plurality of pre-base portions that will be separated from one another later so that each of them will thereby become the base;

bonding at least one electronic component chip to each of the pre-base portions of the wafer; and cutting the wafer so that the pre-base portions are separated from one another and a plurality of bases are thereby formed, the cutting being performed after the bonding, wherein:

the wafer has a top surface and a bottom surface; and the base has a top surface and a bottom surface that correspond to the top surface and the bottom surface of the wafer, and a side surface that couples the top and bottom surfaces to each other;

the method further comprising forming the side surface of the base such that a portion of each of the plurality of external connecting terminals protrudes from the side surface, wherein:

the electronic component package has a top surface and a bottom surface that are opposite to each other, the bottom surface of the electronic component package corresponding to the bottom surface of the base; and none of terminals or electrodes that are electrically connected to any of the plurality of external connecting terminals are exposed in either the top surface or the bottom surface of the electronic component package.

2. The method according to claim 1, wherein the wafer further incorporates a plurality of chip bonding conductor layers to each of which the at least one electronic component chip is to be bonded, the plurality of chip bonding conductor layers being disposed in the plurality of pre-base portions, respectively.

3. The method according to claim 1, wherein the wafer further incorporates a plurality of sets of terminal conductor layers to which the at least one electronic component chip is to be electrically connected, the plurality of sets of terminal conductor layers being connected to the plurality of sets of external connecting terminals.

4. The method according to claim 1, wherein the wafer further incorporates: a plurality of sets of terminal conductor layers to which the at least one electronic component chip is to be electrically connected, the plurality of sets of terminal conductor layers being connected to the plurality of sets of external connecting terminal; and a plurality of chip bonding conductor layers to each of which the at least one electronic component chip is to be bonded, the plurality of chip bonding conductor layers being disposed in the plurality of pre-base portions, respectively.

5. The method according to claim 1, wherein the electronic component chip incorporates a plurality of electrodes, and the electronic component package comprises a plurality of terminal connecting portions each of which connects at least one of the electrodes and at least one of the external connecting terminals to each other, the method further comprising the step of forming the terminal connecting portions between the step of bonding the electronic component chip to each of the pre-base portions and the step of cutting the wafer.

6. The method according to claim 5, wherein each of the pre-base portions has a top surface, the top surface including: a chip bonding surface to which the at least one electronic component chip is to be bonded; and connecting surfaces of the external connecting terminals to which the terminal connecting portions are to be connected, the connecting surfaces being located higher than the chip bonding surface.

7. The method according to claim 5, wherein the step of forming the terminal connecting portions includes the steps of: forming an insulating layer having a flattened top surface and covering the wafer and the electronic component chip; forming a plurality of openings in the insulating layer for exposing the external connecting terminals and the electrodes; and forming the terminal connecting portions by plating so that portions thereof are inserted to the openings.

8. The method according to claim 5, wherein:

the electronic component package comprises a plurality of electronic component chips and further comprises at least one inter-chip connecting portion for electrically connecting electrodes of the plurality of electronic component chips to one another; and the inter-chip connecting portion is formed at a same time as the terminal connecting portions are formed.

9. The method according to claim 1, further comprising the step of forming a sealer for sealing the electronic component chip between the step of bonding the electronic component chip to each of the pre-base portions and the step of cutting the wafer.

10. The method according to claim 1, wherein the retainer incorporates: a base forming portion disposed in each of the pre-base portions; and a portion to be removed made of a material different from a material of the base forming portion and disposed around each of the pre-base portions, each of the external connecting terminals extending across the base forming portion and the portion to be removed, and forming the side surface of the base includes removing the portion to be removed.

\* \* \* \* \*